US010116309B2

(12) United States Patent  
Tanaka

(10) Patent No.: US 10,116,309 B2  
(45) Date of Patent: Oct. 30, 2018

(54) CMOS OUTPUT CIRCUIT

(71) Applicant: Rohm Co., Ltd., Kyoto (JP)

(72) Inventor: Satoshi Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/599,815

(22) Filed: May 19, 2017

(65) Prior Publication Data

US 2017/0338821 A1    Nov. 23, 2017

(30) Foreign Application Priority Data

May 23, 2016   (JP) ................. 2016-102461

(51) Int. Cl.
*H03K 3/00* (2006.01)
*H03K 19/003* (2006.01)
(Continued)

(52) U.S. Cl.
CPC ... *H03K 19/00361* (2013.01); *H03K 19/0013* (2013.01); *H03K 19/0027* (2013.01);
(Continued)

(58) Field of Classification Search
None
See application file for complete search history.

(56) References Cited

U.S. PATENT DOCUMENTS 7,301,376 B2 * 11/2007 Capodivacca ....... H03K 17/063  
                                                    327/112  
8,054,106 B2 * 11/2011 Nakahara ............ H03K 17/063  
                                                    327/108

FOREIGN PATENT DOCUMENTS

JP    2006-228027    8/2006

* cited by examiner

*Primary Examiner* — Long Nguyen  
(74) *Attorney, Agent, or Firm* — Fish & Richardson P.C.

(57) ABSTRACT

A CMOS output circuit includes a first P-MOSFET having a source connected to a power supply terminal, a drain connected to an output terminal, and a back gate connected to a first potential terminal; a first N-MOSEFET having a drain connected to the output terminal, a source connected to the ground terminal, and a back gate connected to a second potential terminal; a first potential switching portion arranged to switch whether to connect the first potential terminal to the power supply terminal or to the output terminal; a second potential switching portion arranged to switch whether to connect the second potential terminal to the ground terminal or to the output terminal; a first gate switching portion arranged to switch whether or not to short-circuit the gate of the first P-MOSFET to the first potential terminal; a second gate switching portion arranged to switch whether or not to short-circuit the gate of the first N-MOSFET to the second potential terminal; a first driver arranged to drive the gate of the first P-MOSFET in accordance with a first input signal; a second driver arranged to drive the gate of the first N-MOSFET in accordance with a second input signal; and a control portion arranged to control individual portions of the circuit when turning off both the first P-MOSFET and the first N-MOSFET, so as to connect the first potential terminal to one of the power supply terminal and the output terminal, which has a higher potential, to connect the second potential terminal to one of the ground terminal and the output terminal, which has a lower potential, to short-circuit the gate of the first P-MOSFET to the first potential terminal, and to short-circuit the gate of the first N-MOSFET to the second potential terminal.

10 Claims, 14 Drawing Sheets

(51) Int. Cl.
*H03K 19/00* (2006.01)
*H03K 19/0185* (2006.01)
*H03K 19/0948* (2006.01)

(52) U.S. Cl.
CPC ........... *H03K 19/018521* (2013.01); *H03K 19/018571* (2013.01); *H03K 19/0948* (2013.01)

FIG. 3

| INP | INN | HIZ | VOUT |
|-----|-----|-----|------|
| L | L | L | L |
| L | H | L | HiZ (IOUT≠0) |
| H | L | L | X |
| H | H | L | H |
| L/H | L/H | H | HiZ (IOUT≒0) | ically a vertical structure of a semiconductor device.
CMOS OUTPUT CIRCUIT

CROSS-REFERENCE TO RELATED APPLICATIONS

This nonprovisional application claims priority under 35 U.S.C. § 119(a) on Patent Application No. 2016-102461 filed in Japan on May 23, 2016, the entire contents of which are hereby incorporated by reference.

BACKGROUND OF THE INVENTION

Field of the Invention

The present invention relates to a complementary metal oxide semiconductor (CMOS) output circuit.

Description of Related Art

FIG. 14 is a circuit diagram illustrating a conventional example of a CMOS output circuit. A CMOS output circuit Z of this conventional example includes a P-channel MOS field-effect transistor M1 and an N-channel MOS field-effect transistor M2 connected in series between a power supply terminal (VCC) and a ground terminal (GND), so as to drive an output voltage VOUT at the connection node between them, in accordance with ON/OFF states thereof.

For example, when the transistor M1 turned on while the transistor M2 is turned off, the output voltage VOUT becomes high level ($\approx$VCC). In addition, when the transistor M1 is turned off while the transistor M2 is turned on, the output voltage VOUT becomes low level ($\approx$GND). In addition, when both the transistors M1 and M2 are turned off, the CMOS output circuit Z becomes an output high impedance state.

Note that, as an example of a conventional technique related to the present invention (reverse current prevention technique), there is JP-A-2006-228027.

Now, the transistors M1 and M2 integrated in a semiconductor device are respectively accompanied with body diodes BD1 and BD2 illustrated in the diagram. In addition, in the conventional MOS output circuit Z, the back gate of the transistor M1 is connected to the power supply terminal while the back gate of the transistor M2 is connected to the ground terminal.

Therefore, in an operating condition where the body diode BD1 or BD2 is forward biased (for example, VCC<VOUT, or VOUT<GND), even if the transistors M1 and M2 are both turned off, unintended output current IOUT (of a few mA, for example) may flow through the body diode BD1 or BD2 (see a dot-dashed line and a two-dot-dashed line in the diagram).

SUMMARY OF THE INVENTION

In view of the above-mentioned problem found by the inventor of the present application, it is an object of the invention disclosed in this specification to provide a CMOS output circuit that can prevent or suppress unintended output current.

Therefore, a CMOS output circuit disclosed in this specification includes a first P-MOSFET having a source connected to a power supply terminal, a drain connected to an output terminal, and a back gate connected to a first potential terminal; a first N-MOSEFET having a drain connected to the output terminal, a source connected to a ground terminal, and a back gate connected to a second potential terminal; a first potential switching portion arranged to switch whether to connect the first potential terminal to the power supply terminal or to the output terminal; a second potential switching portion arranged to switch whether to connect the second potential terminal to the ground terminal or to the output terminal; a first gate switching portion arranged to switch whether or not to short-circuit the gate of the first P-MOSFET to the first potential terminal; a second gate switching portion arranged to switch whether or not to short-circuit the gate of the first N-MOSFET to the second potential terminal; a first driver arranged to drive the gate of the first P-MOSFET in accordance with a first input signal; a second driver arranged to drive the gate of the first N-MOSFET in accordance with a second input signal; and a control portion arranged to control individual portions of the circuit when turning off both the first P-MOSFET and the first N-MOSFET, so as to connect the first potential terminal to one of the power supply terminal and the output terminal, which has a higher potential, to connect the second potential terminal to one of the ground terminal and the output terminal, which has a lower potential, to short-circuit the gate of the first P-MOSFET to the first potential terminal, and to short-circuit the gate of the first N-MOSFET to the second potential terminal.

Note that other features, elements, steps, advantages, and characteristics of the present invention will become more apparent from the description of embodiments given below and the attached drawings related to the description.

BRIEF DESCRIPTION OF THE DRAWINGS

FIG. 3 is a truth table showing input and output states of the CMOS output circuit.

DETAILED DESCRIPTION OF THE PREFERRED EMBODIMENTS

<CMOS Output Circuit>

Figure 1:
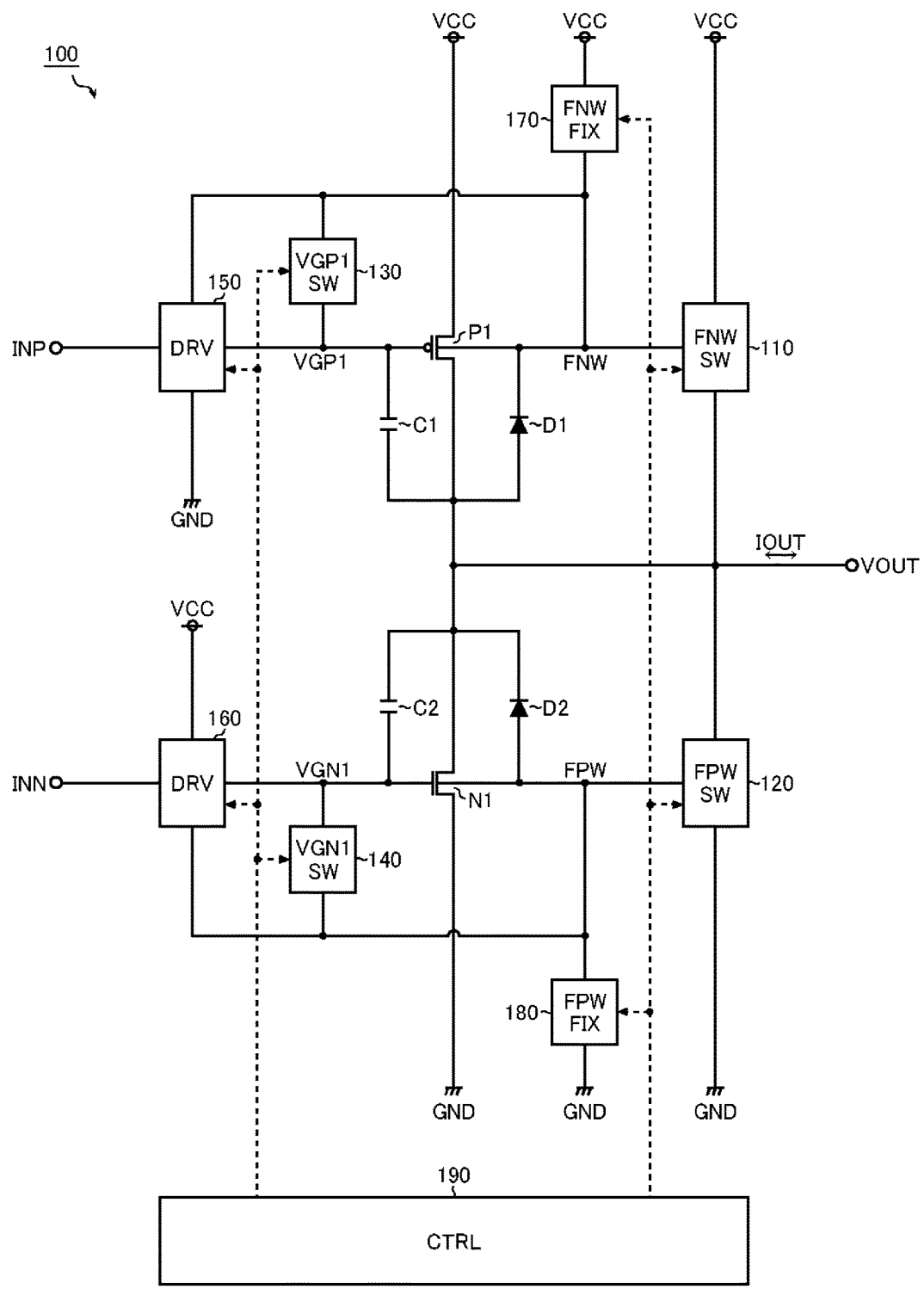
FIG. 1 is a block diagram illustrating an overall structure of a CMOS output circuit.

FIG. 1 is a block diagram illustrating an overall structure of a CMOS output circuit. The CMOS output circuit 100 of this diagram includes a P-channel MOS field-effect transistor P1, an N-channel MOS field-effect transistor N1, a first potential switching portion 110, a second potential switching portion 120, a first gate switching portion 130, a second gate switching portion 140, a first driver 150, a second driver 160, a first potential fixing portion 170, a second potential fixing portion 180, and a control portion 190.

The transistor P1 corresponds to an upper switch of a CMOS output stage. A connection relationship thereof is as follows. The source of the transistor P1 is connected to a power supply terminal (i.e. an application terminal of a power supply voltage VCC). The drain of the transistor P1 is connected to an output terminal (i.e. an application terminal of an output voltage VOUT). The gate of the transistor P1 is connected to an output terminal of the first driver 150 (i.e. an application terminal of a gate voltage VGP1). The back gate of the transistor P1 is connected not to the power supply terminal (VCC) but to a first potential terminal (i.e. an application terminal of a first voltage FNW). Note that a body diode D1 accompanies between the drain and the back gate of the transistor P1 in the direction illustrated in the diagram. In addition, a gate capacitor C1 accompanies between the gate and the drain of the transistor P1 as illustrated in the diagram.

The transistor N1 corresponds to a lower switch of the CMOS output stage. A connection relationship thereof is as follows. The drain of the transistor N1 is connected to the output terminal (VOUT). The source of the transistor N1 is connected to the ground terminal (i.e. an application terminal of a ground voltage GND). The gate of the transistor N1 is connected to an output terminal of the second driver 160 (i.e. an application terminal of a gate voltage VGN1). The back gate of the transistor N1 is connected not to the ground terminal (GND) but to a second potential terminal (i.e. an application terminal of a second voltage FPW). Note that a body diode D2 accompanies between the drain and the back gate of the transistor N1 in the direction illustrated in the diagram. In addition, a gate capacitor C2 accompanies between the gate and the drain of transistor Ni as illustrated in the diagram.

The first potential switching portion 110 switches connection of the first potential terminal (FNW) between the power supply terminal (VCC) and the output terminal (VOUT).

The second potential switching portion 120 switches connection of the second potential terminal (FPW) between the ground terminal (GND) and the output terminal (VOUT).

The first gate switching portion 130 switches whether or not to short-circuit the gate of the transistor P1 to the first potential terminal (FNW).

The second gate switching portion 140 witches whether or not to short-circuit the gate of the transistors P1 to the second potential terminal (FPW).

The first driver 150 is connected between the first potential terminal (FNW) and the ground terminal (GND) so as to drive the gate of the transistor P1 in accordance with an input signal INP.

The second driver 160 is connected between the power supply terminal (VCC) and the second potential terminal (FPW) so as to drive the gate of the transistor N1 in accordance with an input signal INN.

The first potential fixing portion 170 pulls up the first potential terminal (FNW) to the power supply terminal (VCC) so that the first potential terminal (FNW) does not have indefinite potential.

The second potential fixing portion 180 pulls down the second potential terminal (FPW) to the ground terminal (GND) so that the second potential terminal (FPW) does not have indefinite potential.

When the control portion 190 turns off both the transistors P1 and N1, i.e., when it makes the CMOS output circuit 100 be an output high impedance state, it controls the individual portions of the circuit 110 to 180 so that unintended output current IOUT does not flow in the transistor P1 or N1. Specifically, in the first potential switching portion 110, the first potential terminal (FNW) is connected to one of the power supply terminal (VCC) and the output terminal (VOUT), which has a lower potential. In the second potential switching portion 120, the second potential terminal (FPW) is connected to one of the ground terminal (GND) and the output terminal (VOUT), which has a lower potential. In addition, in the first gate switching portion 130, the gate of the transistor P1 is short-circuited to the first potential terminal (FNW). In the second gate switching portion 140, the gate of the transistor N1 is short-circuited to the second potential terminal (FPW).

Hereinafter, a specific circuit structure of the CMOS output circuit 100 is exemplified, and operations thereof as well as actions and effects thereof are described in detail.

First Embodiment

Figure 2:
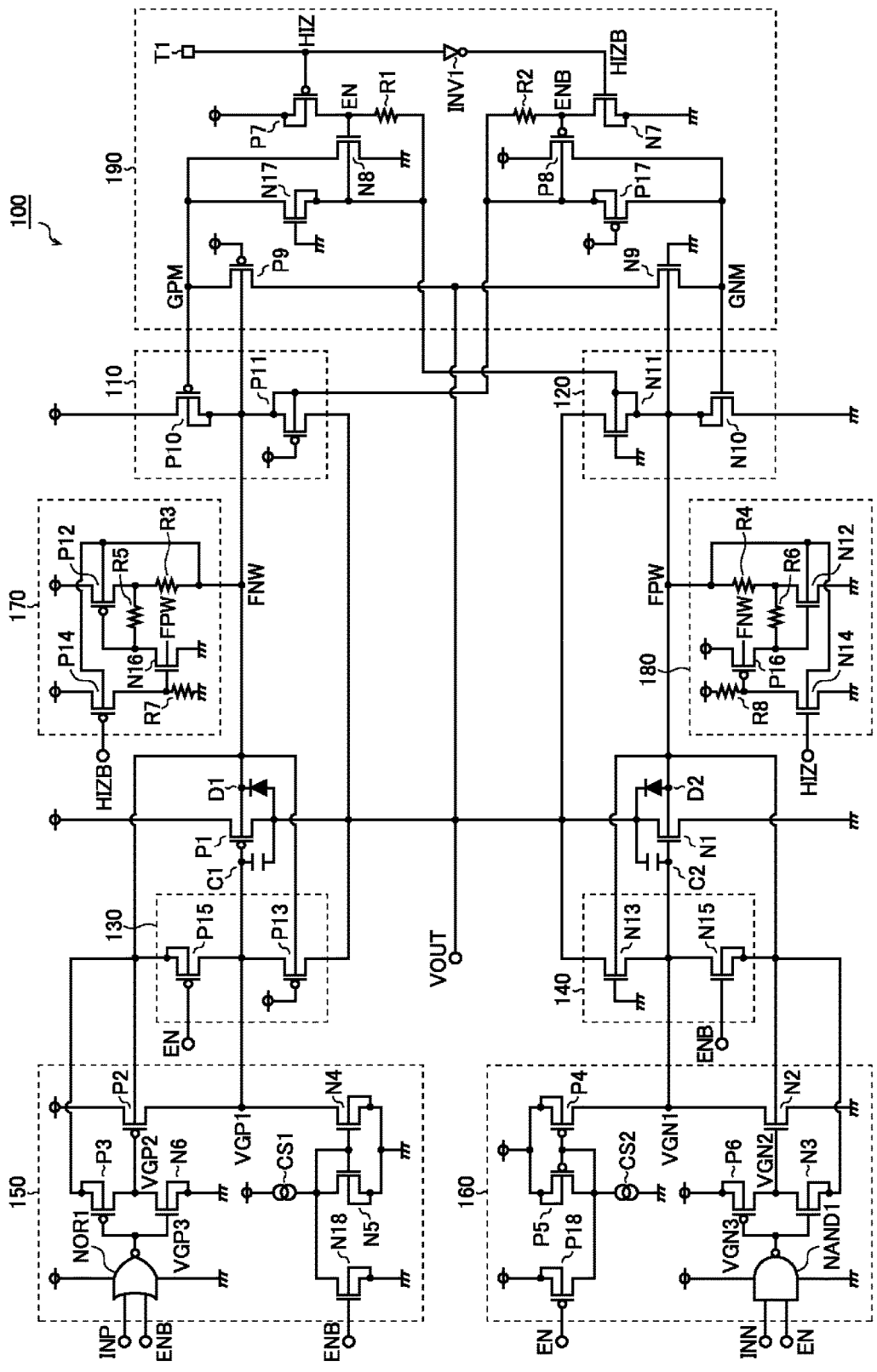
FIG. 2 is a circuit diagram illustrating a first embodiment of the CMOS output circuit.

FIG. 2 is a circuit diagram illustrating a first embodiment of the CMOS output circuit 100. The CMOS output circuit 100 of this embodiment includes, in addition to the transistors P1 and N1 described above, P-channel MOS field-effect transistors P2 to P18, N-channel MOS field-effect transistors N2 to N18, resistors R1 to R8, current sources CS1 and CS2, an external terminal T1, a NOR operator NOR1, a NAND operator NAND1, and an inverter INV1, as elements constituting the individual portions of the circuit 110 to 190.

The source of the transistor P10 is connected to the power supply terminal (VCC). The drain and the back gate of the transistor P10 are connected to the first potential terminal (FNW). The source of the transistor P11 is connected to the output terminal (VOUT). The drain and the back gate of the transistor P11 are connected to the first potential terminal (FNW). The gate of the transistor P11 is connected to the power supply terminal (VCC). The transistors P10 and P11 connected in this way function as the first potential switching portion 110.

The source of the transistor N10 is connected to the ground terminal (GND). The drain and the back gate of the transistor N10 are connected to the second potential terminal (FPW). The source of the transistor N11 is connected to the output terminal (VOUT). The drain and the back gate of the transistor N11 are connected to the second potential terminal (FPW). The gate of the transistor N11 is connected to the ground terminal (GND). The transistors N10 and N11 connected in this way function as the second potential switching portion 120.

The source of the transistor P13 is connected to the output terminal (VOUT). The drain of the transistor P13 is connected to the gate of the transistor P1 (VGP1). The gate of the transistor P13 is connected to the power supply terminal (VCC). The back gate of the transistor P13 is connected to the first potential terminal (FNW). The source and the back gate of the transistor P15 are connected to the first potential terminal (FNW). The drain of the transistor P15 is connected to the gate of the transistor P1 (VGP1). The gate of the transistor P15 is connected to an application terminal of an enable signal EN. The transistors P13 and P15 connected in this way function as the first gate switching portion 130. Note that the transistor P15 corresponds to a first switch that short-circuits between the gate of the transistor P1 (VGP1) and the first potential terminal (FNW), and the transistor P13 corresponds to a second switch that short-circuits between the gate of the transistor P1 (VGP1) and the output terminal (VOUT).

The source of the transistor N13 is connected to the output terminal (VOUT). The drain of the transistor N13 is connected to the gate of the transistor N1 (VGN1). The gate of the transistor N13 is connected to the ground terminal (GND). The back gate of the transistor N13 is connected to the second potential terminal (FPW). The source and the back gate of the transistor N15 are connected to the second potential terminal (FPW). The drain of the transistor N15 is connected to the gate of the transistor Ni (VGN1). The gate of the transistor N15 is connected to an application terminal of an inverted enable signal ENB (i.e. a logically inverted signal of the enable signal EN). The transistors N13 and N15 connected in this way function as the second gate switching portion 140. Note that the transistor N15 corresponds to a third switch that short-circuits between the gate of the transistor N1 (VGN1) and the second potential terminal (FPW), and the transistor N13 corresponds to a fourth switch that short-circuits between the gate of the transistor N1 (VGN1) and the output terminal (VOUT).

The source of the transistor P2 is connected to the power supply terminal (VCC). The drain of the transistor P2 is connected to the gate of the transistor P1 (VGP1). The back gate of the transistor P2 is connected to the first potential terminal (FNW).

The source and the back gate of the transistor P3 are connected to the first potential terminal (FNW). The drain of the transistor P3 is connected to the gate of the transistor P2 (i.e. an application terminal of a gate voltage VGP2).

The source and the back gate of the transistor N4, and the source and the back gate of the transistor N5 are connected to the ground terminal (GND). The drain of the transistor N4 is connected to the gate of the transistor P1 (VGP1). The gate of the transistor N4 and the gate of the transistor N5 are connected to the drain of the transistor N5. The current source CS1 is connected between the drain of the transistor N5 and the power supply terminal (VCC).

The source and the back gate of the transistor N6 are connected to the ground terminal (GND). The drain of the transistor N6 is connected to the gate of the transistor P2 (VGP2). The gate of the transistor N6 as well as the gate of the transistor P3 is connected to an output terminal of the NOR operator NOR1 (i.e. an application terminal of a gate voltage VGP3).

A first input terminal of the NOR operator NOR1 is connected to an application terminal of a first control signal INP. A second input terminal of the NOR operator NOR1 is connected to an application terminal of the inverted enable signal ENB. The output terminal of the NOR operator NOR1 is connected to the gate of the transistors P3 and N6. An upper power supply terminal of the NOR operator NOR1 is connected to the power supply terminal (VCC). A lower power supply terminal of the NOR operator NOR1 is connected to the ground terminal (GND).

The drain of the transistor N18 is connected to the drain of the transistor N5. The source and the back gate of the transistor N18 are connected to the ground terminal (GND). The gate of the transistor N18 is connected to an application terminal of the inverted enable signal ENB.

The transistors P2 and P3, the transistors N4 to N6 and N18, the current source CS1, and the NOR operator NOR1, which are connected as described above, function as the first driver 150.

The source of the transistor N2 is connected to the ground terminal (GND). The drain of the transistor N2 is connected to the gate of the transistor N1 (VGN1). The back gate of the transistor N2 is connected to the second potential terminal (FPW).

The source and the back gate of the transistor N3 are connected to the second potential terminal (FPW). The drain of the transistor N3 is connected to the gate of the transistor N2 (i.e. an application terminal of a gate voltage VGN2).

The source and the back gate of the transistor P4, as well as the source and the back gate of the transistor P5 are connected to the power supply terminal (VCC). The drain of the transistor P4 is connected to the gate of the transistor N1 (VGN1). The gate of the transistor P4 and the gate of the transistor P5 are connected to the drain of the transistor P5. The current source CS2 is connected between the drain of the transistor P5 and the ground terminal (GND).

The source and the back gate of the transistor P6 are connected to the power supply terminal (VCC). The drain of the transistor P6 is connected to the gate of the transistor N2 (VGN2). The gate of the transistor P6 as well as the gate of the transistor N3 is connected to an output terminal of the NAND operator NAND1 (i.e. an application terminal of a gate voltage VGN3).

A first input terminal of the NAND operator NAND1 is connected to an application terminal of the second control signal INN. A second input terminal of the NAND operator NAND1 is connected to an application terminal of an enable signal EN. The output terminal of the NAND operator NAND1 is connected to gates of the transistors N3 and P6. An upper power supply terminal of the NAND operator NAND1 is connected to the power supply terminal (VCC). A lower power supply terminal of the NAND operator NAND1 is connected to the ground terminal (GND).

The drain of the transistor P18 is connected to the drain of the transistor P5. The source and the back gate of the transistor P18 are connected to the power supply terminal (GND). The gate of the transistor P18 is connected to the application terminal of the enable signal EN.

The transistors N2 and N3, the transistors P4 to P6 and P18, the current source CS2, and the NAND operator NAND1, which are connected as described above, function as the second driver 160.

The sources of the transistors P12 and P14 are connected to the power supply terminal (VCC). The back gates of the transistors P12 and P14 are connected to the first potential terminal (FNW). The drain of the transistor P12 is connected to first terminals of the resistors R3 and R5. A second terminal of the resistor R3 is connected to the first potential terminal (FNW). The gate of the transistor P12 is connected to a second terminal of the resistor R5 and the drain of the transistor N16. The source of the transistor N16 is connected to the ground terminal (GND). The gate of the transistor N16 is connected to the drain of the transistor P14 and a first terminal of the resistor R7. A second terminal of the resistor R7 is connected to the ground terminal (GND). The back gate of the transistor N16 is connected to the second potential terminal (FPW). The gate of the transistor P14 is connected to an application terminal of an inverted high impedance control signal HIZB (i.e. a logically inverted signal of a high impedance control signal HIZ). The transistors P12 and P14, the transistor N16, and the resistors R3, R5, and R7, which are connected as described above, function as the first potential fixing portion 170. The resistor R3 corresponds to a current limiting resistor that limits current flowing between the first potential terminal (FNW) and the power supply terminal (VCC).

The sources of the transistors N12 and N14 are connected to the ground terminal (GND). The back gates of the transistors N12 and N14 are connected to the second potential terminal (FPW). The drain of the transistor N12 is connected to first terminals of the resistors R4 and R6. A second terminal of the resistor R4 is connected to the second potential terminal (FPW). The gate of the transistor N12 is connected to a second terminal of the resistor R6 and the drain of the transistor P16. The source of the transistor P16 is connected to the power supply terminal (VCC). The gate of the transistor P16 is connected to the drain of the transistor N14 and a first terminal of the resistor R8. A second terminal of the resistor R8 is connected to the power supply terminal (VCC). The back gate of the transistor P16 is connected to the first potential terminal (FNW). The gate of the transistor N14 is connected to an application terminal of the high impedance control signal HIZB. The transistors N12 and N14, the transistor P16, and the resistors R4, R6, and R8, which are connected as described above, function as the second potential fixing portion 180. The resistor R4 corresponds to a current limiting resistor that limits current flowing between the second potential terminal (FPW) and the ground terminal (GND).

The gate of the transistor P7 is connected to the external terminal T1 that receives an input of the high impedance control signal HIZ. The source and the back gate of the transistor P7 are connected to the power supply terminal (VCC). The drain of the transistor P7, which is an output terminal of the enable signal EN, is connected to the gate of the transistor N8 and a first terminal of the resistor R1. The source of the transistor N8 is connected to the ground terminal (GND). The drains of the transistors N8, N17, and P9 are connected to the gate of the transistor P10 (i.e. an application terminal of a gate voltage GPM). The gate of the transistor N17 is connected to the ground terminal (GND). The back gate of the transistor N8, the source and the back gate of the transistor N17, and a second terminal of the resistor R1 are connected to the back gate of the transistor N11. The gate of the transistor P9 is connected to the power supply terminal (VCC). The source of the transistor P9 is connected to the output terminal (VOUT). The back gate of the transistor P9 is connected to the first potential terminal (FNW).

The input terminal of the inverter INV1 is connected to the external terminal T1 (HIZ). The output terminal of the inverter INV1, which is an output terminal of the inverted high impedance control signal HIZB, is connected to the gate of the transistor N7. Note that, although not illustrated in this diagram, an upper power supply terminal of the inverter INV1 is connected to the power supply terminal (VCC). In addition, a lower power supply terminal of the inverter INV1 is connected to the ground terminal (GND). The source and the back gate of the transistor N7 are connected to the ground terminal (GND). The drain of the transistor N7, which is the output terminal of the inverted enable signal ENB, is connected to the gate of the transistor P8 and a first terminal of the resistor R2. The source of the transistor P8 is connected to the power supply terminal (VCC). The drains of the transistors P8, P17, and N9 are connected to the gate of the transistor N10 (i.e. an application terminal of a gate voltage GNM). The gate of the transistor P17 is connected to the power supply terminal (VCC). The back gate of the transistor P8, the source and the back gate of the transistor P17, and a second terminal of the resistor R2 are connected to the back gate of the transistor P11. The gate of the transistor N9 is connected to the ground terminal (GND). The source of the transistor N9 is connected to the output terminal (VOUT). The back gate of the transistor N9 is connected to the second potential terminal (FPW).

The transistors P7 to P9, P17, N7 to N9, and N17, the resistors R1 and R2, the inverter INV1, and the external terminal T1, which are connected as described above, function as the control portion 190, so as to control the individual portions of the CMOS output circuit 100 in accordance with the high impedance control signal HIZ.

FIG. 3 is a truth table showing input and output states of the CMOS output circuit 100, in which a correlation relationship among the input signals INP and INN, the high impedance control signal HIZ, and the output voltage VOUT is shown.

When HIZ is low level, the output state of the CMOS output circuit 100 is controlled in accordance with logic levels of the input signals INP and INN. For example, when both INP and INN are low level, VOUT becomes low level. When both INP and INN are high level, VOUT becomes high level. In addition, when INP is low level while INN is high level, the CMOS output circuit 100 becomes the output high impedance state. Note that, a combination of high level INP and low level INN is inhibited for preventing simultaneous turning on of the transistors P1 and N1.

On the other hand, when HIZ is high level, the CMOS output circuit 100 becomes the output high impedance state regardless of logic levels of the input signals INP and INN. In particular, when HIZ is high level, the unintended output current IOUT in the output high impedance state is prevented or suppressed, unlike the case where HIZ is low level, INP is low level, and INN is high level.

Hereinafter, operating states of the CMOS output circuit 100 in various conditions are described in detail with specific examples.

Figure 4:
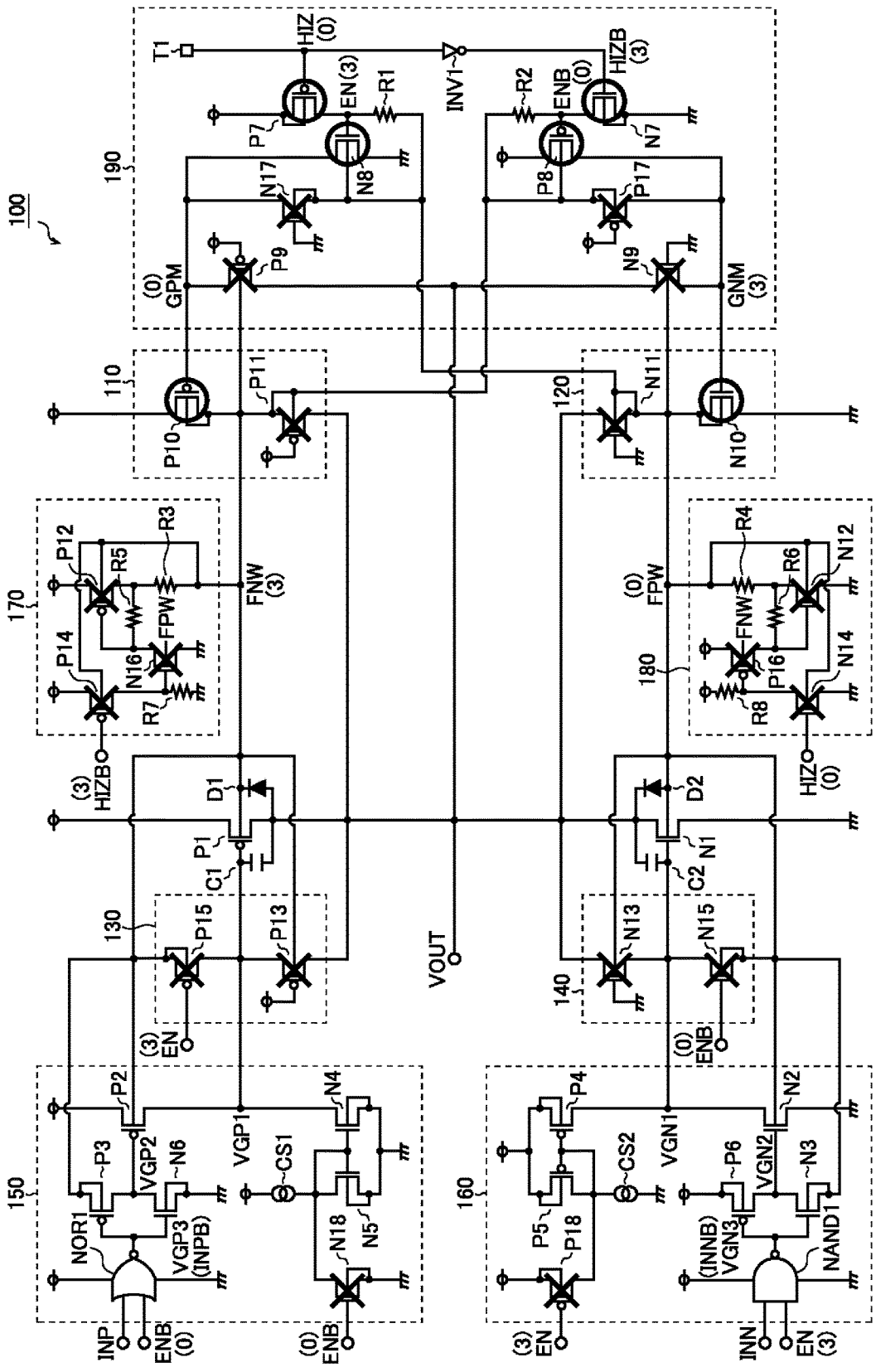
FIG. 4 is a circuit diagram illustrating an operating state of the CMOS output circuit in a first condition.

FIG. 4 is a circuit diagram illustrating an operating state of the CMOS output circuit 100 in a first condition (VCC is 3 V, GND is 0 V, HIZ is 0 V, GND≤VOUT≤VCC). The first condition corresponds to cases where HIZ is low level in the truth table of FIG. 3.

First, the control portion 190 is noted and described. When HIZ is 0 V, the transistor P7 is turned on so that EN becomes 3 V (i.e. VCC), and hence the transistor N8 is turned on. In addition, in the first condition described above, the transistors P9 and N17 are turned off. Therefore, GPM becomes 0 V (i.e. GND). In addition, when HIZ is 0 V, HIZB becomes 3 V (i.e. VCC), and the transistor N7 is turned on so that ENB becomes 0 V (i.e. GND), and hence the transistor P8 is turned on. In addition, in the first condition described above, the transistors N9 and P17 are both turned off. Therefore, GNM becomes 3 V (i.e. VCC).

Next, the first potential switching portion 110 is noted and described. When GPM is 0 V (i.e. GND), the transistor P10 is turned on. On the other hand, in the first condition described above, the transistor P11 is turned off. Therefore, FNW becomes 3 V (i.e. VCC). In other words, the back gate of the transistor P1 is connected to the power supply terminal (VCC) via the transistor P10.

Next, the second potential switching portion 120 is noted and described. When GNM is 3 V (i.e. VCC), the transistor N10 is turned on. On the other hand, in the first condition described above, the transistor N11 is turned off. Therefore, FPW becomes 0 V (i.e. GND). In other words, the back gate of the transistor N1 is connected to the ground terminal (GND) via the transistor N10.

Next, the first gate switching portion 130 is noted and described. When EN is 3 V (i.e. VCC), the transistor P15 is turned off. In addition, in the first condition described above, the transistor P13 is also turned off. Therefore, the first gate switching portion 130 becomes the operation stop state (i.e. a state that does not affect the gate of the transistor P1 (VGP1)).

Next, the second gate switching portion 140 is noted and described. When ENB is 0 V (i.e. GND), the transistor N15 is turned off. In addition, in the first condition described above, the transistor N13 is also turned off. Therefore, the second gate switching portion 140 becomes the operation stop state (i.e. a state that does not affect the gate of the transistor N1 (VGN1)).

Next, the first driver 150 is noted and described. When ENB is 0 V (i.e. GND), the NOR operator NOR1 outputs an inverted input signal INPB (i.e. a logically inverted signal of the input signal INP), and hence VGP3 becomes INPB. In addition, when ENB is 0 V (i.e. GND), the transistor N18 is turned off. Therefore, a current mirror constituted of the transistors N4 and N5 becomes effective, and hence a slew rate adjustment function of the gate voltage VGP1 by the current source CS1 becomes effective.

Next, the second driver 160 is noted and described. When EN is 3 V (i.e. VCC), the NAND operator NAND1 outputs an inverted input signal INNB (i.e. a logically inverted signal of the input signal INN), and hence VGN3 becomes INNB. In addition, when EN is 3 V (i.e. VCC), the transistor P18 is turned off. Therefore, a current mirror constituted of the transistors P4 and P5 becomes effective, and hence a slew rate adjustment function of the gate voltage VGN1 by the current source CS2 becomes effective.

Next, the first potential fixing portion 170 is noted and described. When HIZB is 3 V (i.e. VCC), the transistor P14 is turned off, and hence the transistor N16 is turned off. Further, the transistor P12 is turned off. As a result, the first potential fixing portion 170 becomes the operation stop state (i.e. a state that does not affect the first potential terminal (FNW)).

Next, the second potential fixing portion 180 is noted and described. When HIZ is 0 V (i.e. GND), the transistor N14 is turned off, and hence the transistor P16 is turned off. Further, the transistor N12 is turned off. As a result, the second potential fixing portion 180 becomes the operation stop state (i.e. a state that does not affect the second potential terminal (FPW)).

In this way, in the first condition described above, the CMOS output circuit 100 has a circuit structure equivalent to the conventional one. Therefore, the output state of the CMOS output circuit 100 is controlled in accordance with logic levels of the input signals INP and INN.

For example, when INP and INN are both low level, VGP3 and VGN3 are both high level, and hence the transistors N6 and N3 are turned on, while the transistors P3 and P6 are turned off. In this case, VGP2 and VGN2 are both 0 V, and hence the transistor P2 is turned on, while the transistor N2 is turned off Therefore, VGP1 and VGN1 are both 3 V (i.e. VCC), and hence the transistor P1 is turned off, while the transistor N1 is turned on. As a result, VOUT becomes 0 V (i.e. GND) (see INP=L, INN=L, and VOUT=L in FIG. 3).

On the other hand, when INP and INN are both high level, VGP3 and VGN3 are both low level, and hence the transistors N6 and N3 are turned off, while the transistors P3 and P6 are turned on. In this case, VGP2 and VGN2 are both 3 V, and hence the transistor P2 is turned off, while the transistor N2 is turned on. Therefore, VGP1 and VGN1 are both 0 V (i.e. GND), and hence the transistor P1 is turned on, while the transistor N1 is turned off. As a result, VOUT becomes 3 V (i.e. VCC) (see INP=H, INN=H, and VOUT=H in FIG. 3).

In addition, when INP is low level while INN is high level, VGP3 becomes high level, and VGN3 becomes low level. Therefore, the transistors N6 and P6 are turned on, while the transistors P3 and N3 are turned off In this case, VGP2 is 0 V (i.e. GND), while VGN2 is 3 V (i.e. VCC), and hence the transistors P2 and N2 are both turned on. Therefore, VGP1 becomes 3 V (i.e. VCC), while VGN1 becomes 0 V (i.e. GND), and hence the transistors P1 and N1 are both turned off. As a result, the CMOS output circuit 100 becomes the output high impedance state (see INP=L, INN=H, VOUT=HiZ in FIG. 3).

Note that, when HIZ is low level, the CMOS output circuit 100 has a circuit structure equivalent to the conventional one as described above. Therefore, if the condition "GND≤VOUT≤VCC" is not satisfied, even if the CMOS output circuit 100 is in the output high impedance state, the unintended output current IOUT may be generated.

For example, if VCC is lower than VOUT, the output current IOUT may flow in a current path from the output terminal (VOUT) to the power supply terminal (VCC) via the body diode D1 and the transistor P10. In addition, when VOUT is lower than the GND level, the output current IOUT may flow in a current path from the ground terminal (GND) to the output terminal (VOUT) via the transistor N10 and the body diode D2.

In view of above, when making the CMOS output circuit 100 be the output high impedance state, it is preferred to satisfy "HIZ=H". The reason thereof is described below in detail with a specific example.

Figure 5:
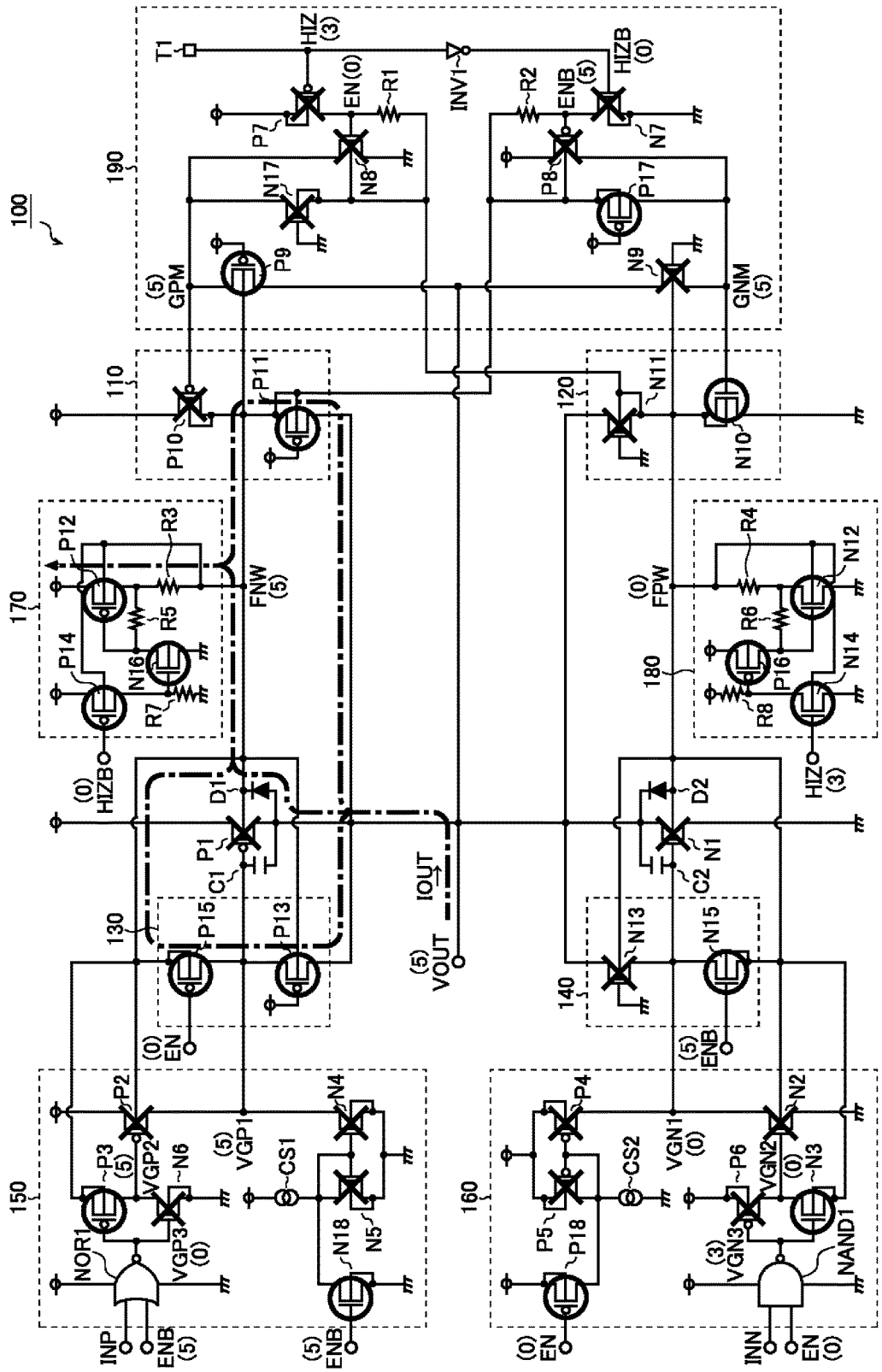
FIG. 5 is a circuit diagram illustrating an operating state of the CMOS output circuit in a second condition.

FIG. 5 is a circuit diagram illustrating the operating state of the CMOS output circuit 100 in a second condition (VCC is 3 V, GND is 0 V, HIZ is 3 V, VOUT is 5 V). The second condition described above corresponds to an example in the case where HIZ is high level in the truth table of FIG. 3 (VCC<VOUT).

First, the control portion 190 is noted and described. When HIZ is 3 V, the transistor P7 is turned off. In this case, EN becomes 0 V (=FPW=GND) via a pull down path of the resistor R1, and hence the transistor N8 is turned off. In addition, in the second condition described above, the transistor P9 is turned on, while the transistor N17 is turned off. As a result, GPM becomes 5 V (i.e. VOUT). In addition, when HIZ is 3 V, HIZB becomes 0 V (i.e. GND), and the transistor N7 is turned off. In this case, ENB becomes 5 V (=FNW=VOUT) via a pull up path of the resistor R2, and hence the transistor P8 is turned off. In addition, in the second condition described above, the transistor N9 is turned off, while the transistor P17 is turned on. As a result, GNM becomes 5 V (=FNW=VOUT).

Next, the first potential switching portion 110 is noted and described. When GPM is 5 V (i.e. VOUT), the transistor P10 is turned off. On the other hand, in the second condition described above, the transistor P11 is turned on. Therefore, FNW becomes 5 V (i.e. VOUT). In other words, the back gate of the transistor P1 is connected to the output terminal (VOUT) via the transistor P11.

Next, the second potential switching portion 120 is noted and described. When GNM is 5 V (=FNW=VOUT), the transistor N10 is turned on. On the other hand, in the second condition described above, the transistor N11 is turned off. Therefore, FPW becomes 0 V (i.e. GND). In other words, the back gate of the transistor Ni is connected to the ground terminal (GND) via the transistor N10.

Next, the first gate switching portion 130 is noted and described. When EN is 0 V (=FPW=GND), the transistor P15 is turned on. In addition, in the second condition described above, the transistor P13 is also turned on. Therefore, the first gate switching portion 130 short-circuits the gate of the transistor P1 (VGP1) to the first potential terminal (FNW) and to the output terminal (VOUT). As a result, because VGP1 becomes 5 V (=FNW=VOUT), the transistor P1 is turned off.

Next, the second gate switching portion 140 is noted and described. When ENB is 5 V (=FNW=VOUT), the transistor N15 is turned on. On the other hand, in the second condition described above, the transistor N13 is turned off. Therefore, the second gate switching portion 140 short-circuits the gate of the transistor N1 (VGN1) to the second potential terminal (FPW). As a result, VGN1 becomes 0 V (=FPW=GND), and hence the transistor N1 is turned off.

Next, the first driver 150 is noted and described. When ENB is 5 V (=FNW=VOUT), the NOR operator NOR1 always outputs low level regardless of the input signal INP, and hence VGP3 becomes 0 V (i.e. GND). In this case, the transistor P3 is turned on, while the transistor N6 is turned off, and hence VGP2 becomes 5 V (=FNW=VOUT). As a result, the transistor P2 is turned off. In addition, when ENB is 5 V (=FNW=VOUT), the transistor N18 is turned on. Therefore, the transistors N4 and N5 are turned off, and the slew rate adjustment function of the gate voltage VGP1 by the current source CS1 becomes ineffective. In this way, when ENB is 5 V (=FNW=VOUT), the first driver 150 becomes the operation stop state (i.e. a state that does not affect the gate of the transistor P1 (VGP1)).

Next, the second driver 160 is noted and described. When EN is 0 V (=FPW=GND), the NAND operator NAND1 always outputs high level regardless of the input signal INN, and hence VGN3 becomes 3 V (i.e. VCC). In this case, the transistor N3 is turned on, while the transistor P6 is turned off, and hence VGN2 becomes 0 V (=FPW=GND). As a result, the transistor N2 is turned off. In addition, when EN is 0 V (=FPW=GND), the transistor P18 is turned on. Therefore, the transistors P4 and P5 are turned off, and hence the slew rate adjustment function of the gate voltage VGN1 by the current source CS2 becomes ineffective. In this way, when EN is 0 V (=FPW=GND), the second driver 160 becomes the operation stop state (i.e. the state that does not affect the gate of the transistor N1 (VGN1)).

Next, the first potential fixing portion 170 is noted and described. When HIZB is 0 V (i.e. GND), the transistor P14 is turned on, and hence the transistor N16 is turned on. Further, the transistor P12 is turned off. As a result, the first potential fixing portion 170 conducts between the first potential terminal (FNW) and the power supply terminal (VCC) via the resistor R3 and the transistor P12. However, in the second condition described above, the transistor P11 having a lower impedance conducts between the first potential terminal (FNW) and the output terminal (VOUT), and hence the first potential fixing portion 170 becomes a state that hardly affects the first potential terminal (FNW).

Next, the second potential fixing portion 180 is noted and described. When HIZ is 3 V (i.e. VCC), the transistor N14 is turned on, and hence the transistor P16 is turned on. Further, the transistor N12 is turned off. As a result, the second potential fixing portion 180 conducts between the second potential terminal (FPW) and the ground terminal (GND) via the resistor R4 and the transistor N12. However, in the second condition described above, the transistor N10 having a lower impedance conducts between the second potential terminal (FPW) and the ground terminal (GND), and hence the second potential fixing portion 180 becomes a state that hardly affects the second potential terminal (FPW).

In this way, in the second condition described above, a connection destination of the first potential terminal (FNW) corresponding to the back gate of the transistor P1 is switched from the power supply terminal (VCC) to the output terminal (VOUT) as a highest potential point of the system. Therefore, unlike the above FIG. 4, the current path through the body diode D1 (VOUT to D1 to P10 to VCC) is cut off, and hence unintended output current IOUT does not flow in the current path.

In addition, in the second condition described above, because VGP1 is VOUT, the transistor P1 is not turned on by mistake. Therefore, the unintended output current IOUT does not flow in the current path through transistor P1 (VOUT to P1 to VCC).

In addition, the source of the transistor P3 is connected not to the power supply terminal (VCC) but to the first potential terminal (FNW). In the second condition described above, VGP2 is equal to VGP1 (i.e. VOUT), and hence the transistor P2 is not turned on by mistake. Therefore, the unintended output current IOUT does not flow in the current path through the transistor P2 (for example, VOUT to P13 to P2 to VCC).

Note that, when the first potential fixing portion 170 is introduced, in the second condition described above, the unintended output current IOUT flows in the current path through the resistor R3 (VOUT to P11 or D1 to R3 to P12 to VCC; or VOUT to P13 to P15 to R3 to P12 to VCC) as illustrated by a dot-dashed line in the diagram. However, by setting the resistor R3 to have a sufficiently high resistance (of a few MΩ), it is possible to control the output current IOUT flowing in the current path to have a current value (of a few pA) smaller than conventional one.

Figure 6:
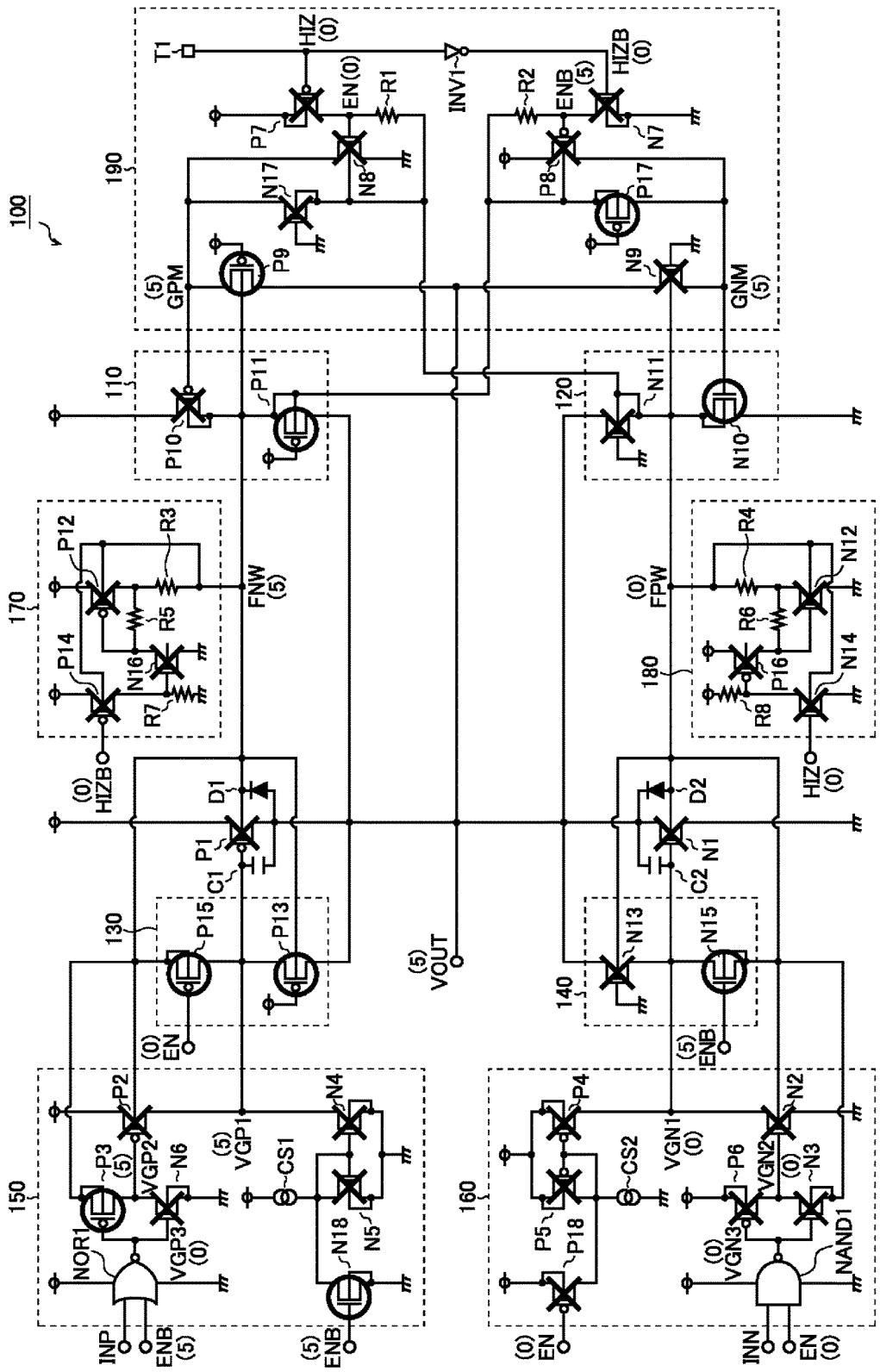
FIG. 6 is a circuit diagram illustrating an operating state of the CMOS output circuit in a third condition.

FIG. 6 is a circuit diagram illustrating an operating state of the CMOS output circuit 100 in a third condition (VCC is 0 V, GND is 0 V, HIZ is 0 V, and VOUT is 5 V). Note that the third condition corresponds to a state where a positive output voltage VOUT (=5 V) is applied when the power is not turned on (VCC=0 V). Hereinafter, with reference to this diagram, meaning of introducing the transistor P17 is described in detail.

When the power is not turned on, all the transistor N7, the transistor P8, and the transistor N9 are turned off. Therefore, if the transistor P17 is not disposed, the gate of voltage GNM of the transistor N10 becomes indefinite. In addition, when the power is not turned on, the second potential fixing portion 180 also becomes the operation stop state. Therefore, when the transistor N10 is turned off, the second potential terminal (FPW) becomes a floating state.

When the second potential terminal (FPW) becomes a floating state, the gate of the transistor N1 (VGN1) also becomes a floating state, and hence the transistor N1 cannot be securely maintained in the off state. If the transistor N1 happens to be turned on by mistake, excessive output current IOUT flows in the current path through the transistor N1 (VOUT to N1 to GND) and hence may cause abnormal heating or breakage of the CMOS output circuit 100.

On the other hand, with the structure including the transistor P17, the transistor P17 is turned on in the third condition described above, and GNM is VOUT, and thus the transistor N10 is turned on. Therefore, FPW is GND level, and hence the transistor N1 can be securely turned off.

Note that the transistor P17 is merely the output leakage preventing means when the power is not turned on and does not affect an operation of the control portion 190 after the power is turned on.

Figure 7:
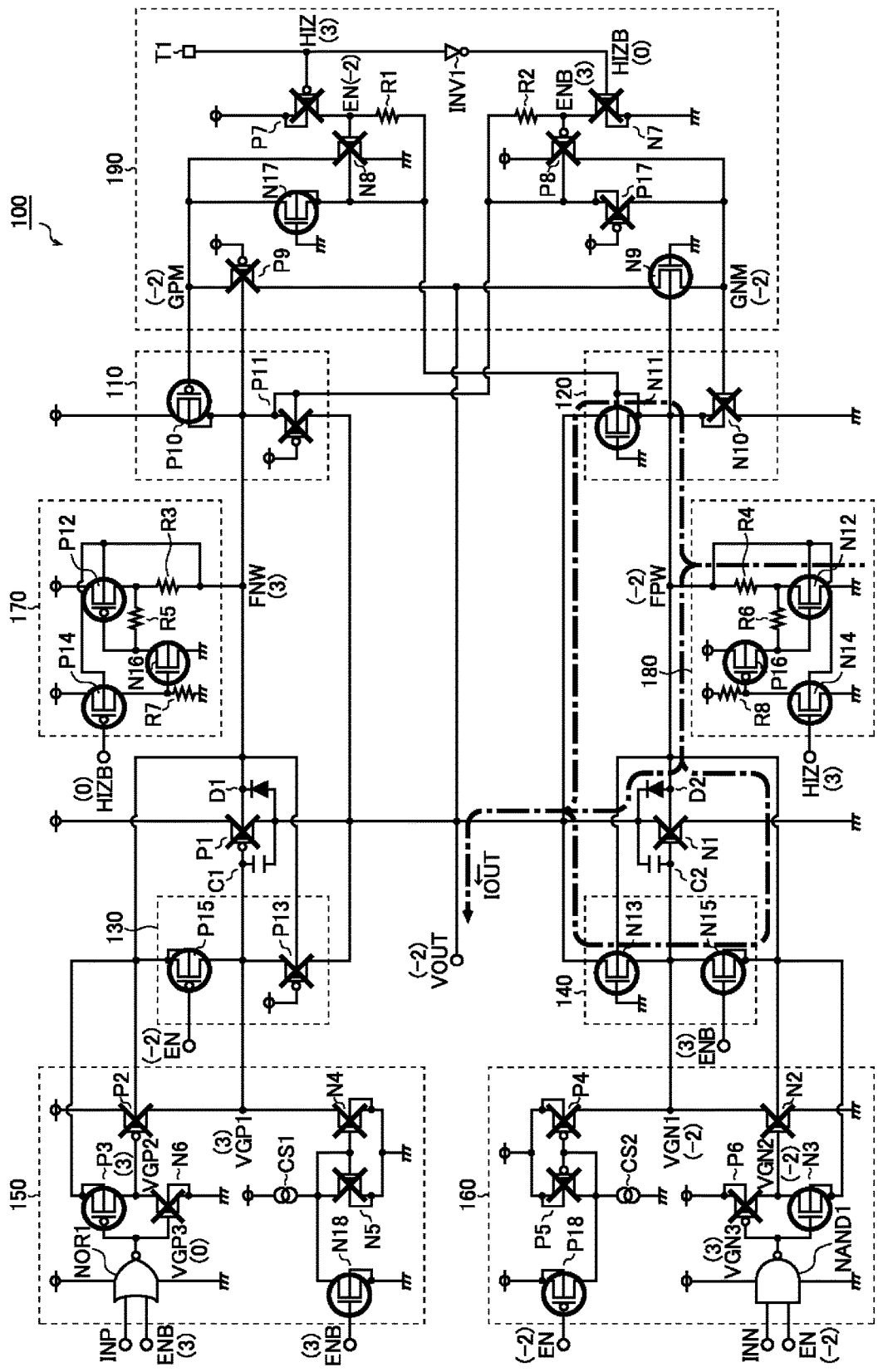
FIG. 7 is a circuit diagram illustrating an operating state of the CMOS output circuit in a fourth condition.

FIG. 7 is a circuit diagram illustrating an operating state of the CMOS output circuit 100 in a fourth condition (VCC is 3 V, GND is 0 V, HIZ is 3 V, VOUT is −2 V). The fourth condition described above corresponds to an example in the case where HIZ is high level in the truth table of FIG. 3 (VOUT<GND).

First, the control portion 190 is noted and described. When HIZ is 3 V, the transistor P7 is turned off. In this case, EN becomes −2 V (=FPW=VOUT) via the pull down path of the resistor R1, and hence the transistor N8 is turned off. In addition, in the fourth condition described above, the transistor P9 is turned off, while the transistor N17 is turned on. As a result, GPM becomes −2 V (=FPW=VOUT). In addition, when HIZ is 3 V, HIZB is 0 V (i.e. GND), and hence the transistor N7 is turned off. In this case, ENB becomes 3 V (=FNW=VCC) via the pull up path of the resistor R2, and hence the transistor P8 is turned off. In addition, in the fourth condition described above, the transistor N9 is turned on, while the transistor P17 is turned off. As a result, GNM becomes −2 V (i.e. VOUT).

Next, the first potential switching portion 110 is noted and described. When GPM is −2 V (=FPW=VOUT), the transistor P10 is turned on. On the other hand, in the fourth condition described above, the transistor P11 is turned off. Therefore, FNW becomes 3 V (i.e. VCC). In other words, the back gate of the transistor P1 is connected to the power supply terminal (VCC) via the transistor P10.

Next, the second potential switching portion 120 is noted and described. When GNM is −2 V (i.e. VOUT), the transistor N10 is turned off. On the other hand, in the fourth condition described above, the transistor N11 is turned on. Therefore, FPW becomes −2 V (i.e. VOUT). In other words, the back gate of the transistor N1 is connected to the output terminal (VOUT) via the transistor N11.

Next, the first gate switching portion 130 is noted and described. When EN is −2 V (=FPW=VOUT), the transistor P15 is turned on. On the other hand, in the fourth condition described above, the transistor P13 is turned off. Therefore, the first gate switching portion 130 short-circuits the gate of the transistor P1 (VGP1) to the first potential terminal (FNW). As a result, VGP 1 becomes 3 V (=FNW=VCC), and hence the transistor P1 is turned off Next, the second gate switching portion 140 is noted and described. When ENB is 3 V (=FNW=VCC), the transistor N15 is turned on. In addition, in the fourth condition described above, the transistor N13 is also turned on. Therefore, the second gate switching portion 140 short-circuits the gate of the transistor N1 (VGN1) to the second potential terminal (FPW) and the output terminal (VOUT). As a result, VGN1 becomes −2 V (=FPW=VOUT), and hence the transistor N1 is turned off.

Next, the first driver 150 is noted and described. When ENB is 3 V (=FNW=VCC), the NOR operator NOR1 always outputs low level regardless of the input signal INP, and hence VGP3 becomes 0 V (i.e. GND). In this case, the transistor P3 is turned on, while the transistor N6 is turned off, and hence VGP2 becomes 3 V (=FNW=VCC). As a result, the transistor P2 is turned off. In addition, when ENB is 3 V (=FNW=VCC), the transistor N18 is turned on. Therefore, the transistors N4 and N5 are turned off, and the slew rate adjustment function of the gate voltage VGP1 by the current source CS1 becomes ineffective. In this way, when ENB is 3 V (=FNW=VCC), the first driver 150 becomes the operation stop state.

Next, the second driver 160 is noted and described. When EN is −2 V (=FPW=VOUT), the NAND operator NAND1 always outputs high level regardless of the input signal INN, and hence VGN3 becomes 3 V (i.e. VCC). In this case, the transistor N3 is turned on, while the transistor P6 is turned off, and hence VGN2 becomes −2 V (=FPW=VOUT). As a result, the transistor N2 is turned off. In addition, when EN is −2 V (=FPW=VOUT), the transistor P18 is turned on. Therefore, the transistors P4 and P5 are turned off, and hence the slew rate adjustment function of the gate voltage VGN1 by the current source CS2 becomes ineffective. In this way, when EN is −2 V (=FPW=VOUT), the second driver 160 becomes the operation stop state.

Next, the first potential fixing portion 170 is noted and described. When HIZB is 0 V (i.e. GND), the transistor P14 is turned on, and hence the transistor N16 is turned on. Further, the transistor P12 is turned off. As a result, the first potential fixing portion 170 conducts between the first potential terminal (FNW) and the power supply terminal (VCC) via the resistor R3 and the transistor P12. However, in the fourth condition described above, the transistor P10 having a lower impedance conducts between the first potential terminal (FNW) and the power supply terminal (VCC), and hence the first potential fixing portion 170 becomes the state that hardly affects the first potential terminal (FNW).

Next, the second potential fixing portion 180 is noted and described. When HIZ is 3 V (i.e. VCC), the transistor N14 is turned on, and hence the transistor P16 is turned on. Further, the transistor N12 is turned off. As a result, the second potential fixing portion 180 conducts between the second potential terminal (FPW) and the ground terminal (GND) via the resistor R4 and the transistor N12. However, in the fourth condition described above, the transistor N11 having a lower impedance conducts between the second potential terminal (FPW) and the output terminal (VOUT), and hence the second potential fixing portion 180 becomes the state that hardly affects the second potential terminal (FPW).

In this way, in the fourth condition described above, a connection destination of the second potential terminal (FPW) corresponding to the back gate of the transistor N1 is switched from the ground terminal (GND) to the output terminal (VOUT) as a lowest potential point of the system. Therefore, unlike the above FIG. 4, the current path through the body diode D2 (GND to N10 to D2 to VOUT) is cut off, and hence the unintended output current IOUT does not flow in the current path.

In addition, in the fourth condition described above, VGN1 becomes equal to VOUT, and hence the transistor N1 is not turned on by mistake. Therefore, the unintended output current IOUT does not flow in the current path through the transistor N1 (GND to N1 to VOUT).

In addition, the source of the transistor N3 is connected not to the ground terminal (GND) but to the second potential terminal (FPW). In the fourth condition described above, VGN2 becomes VGN1 (i.e. VOUT), and hence the transistor N2 is not turned on by mistake. Therefore, the unintended output current IOUT does not flow in the current path through the transistor N2 (for example, GND to N2 to N13 to VOUT).

Note that, when the second potential fixing portion 180 is introduced, in the fourth condition described above, as illustrated by a dot-dashed line in the diagram, the unintended output current IOUT flows in the current path through the resistor R4 (GND to N12 to R4 to N11 or D2 to VOUT; or GND to N12 to R4 to N15 to N13 to VOUT). However, by setting the resistor R4 to have a sufficiently high resistance (a few MΩ), it is possible to control the output current IOUT flowing in the current path to have a current value (a few μA) smaller than conventional one.

Figure 8:
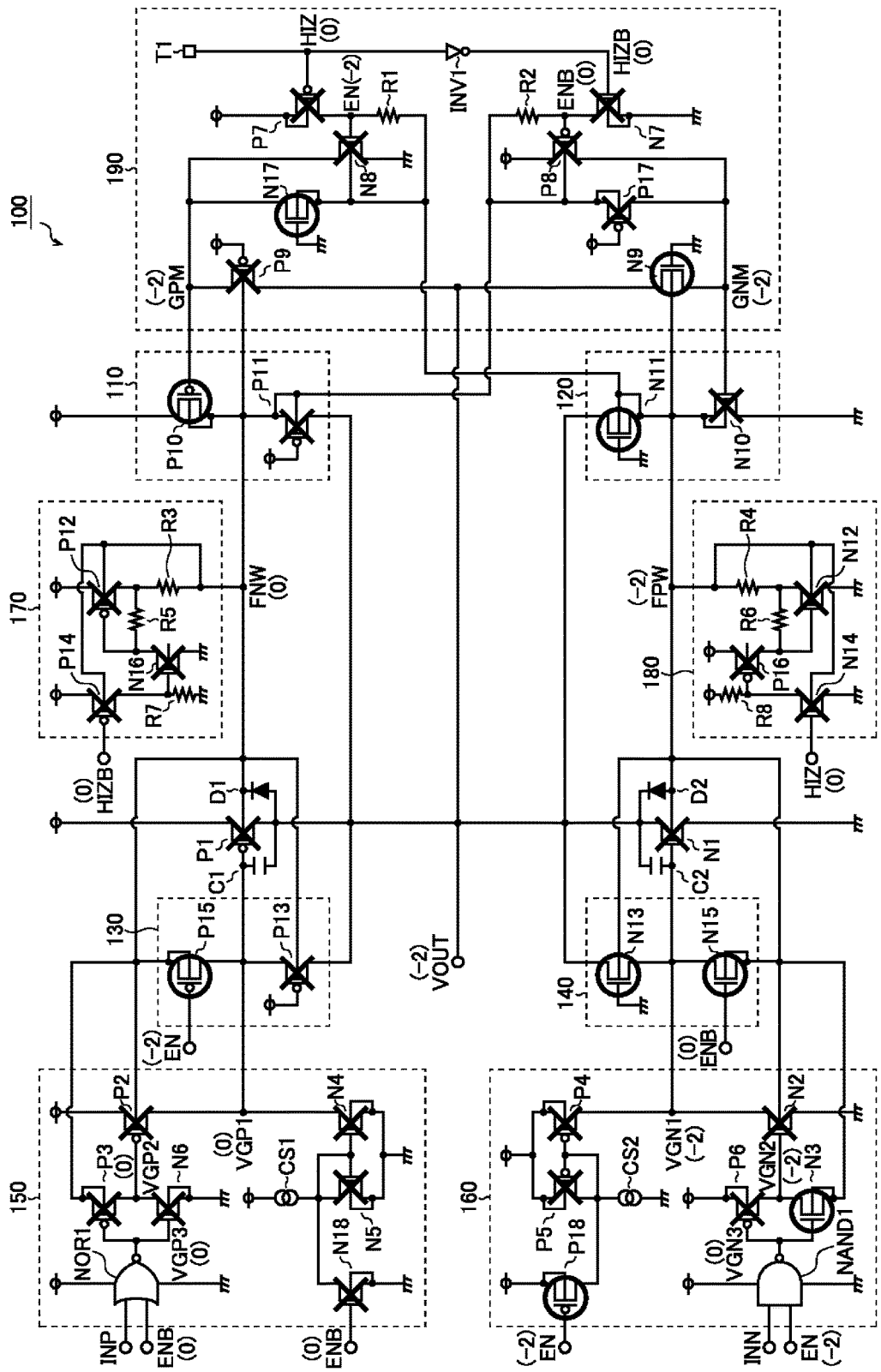
FIG. 8 is a circuit diagram illustrating an operating state of the CMOS output circuit in a fifth condition.

FIG. 8 is a circuit diagram illustrating an operating state of the CMOS output circuit 100 in a fifth condition (VCC is 0 V, GND is 0 V, HIZ is 0 V, and VOUT is −2 V). Note that the above fifth condition corresponds to a state where a negative output voltage VOUT (=−2 V) is applied when the power is not turned on (VCC is 0 V). Hereinafter, with reference to the drawings, meaning of introducing the transistor N17 is described in detail.

When the power is not turned on, all the transistor P7, the transistor N8, and the transistor P9 are turned off. Therefore, if the transistor N17 is not disposed, the gate of voltage GPM of the transistor P10 becomes indefinite. In addition, when the power is not turned on, the first potential fixing portion 170 also becomes the operation stop state. Therefore, when the transistor P10 is turned off, the first potential terminal (FNW) becomes a floating state.

When the first potential terminal (FNW) becomes a floating state, the gate of the transistor P1 (VGP I) also becomes a floating state, and hence the transistor P1 cannot be securely maintained in the off state. If the transistor P1 happens to be turned on by mistake, excessive output current IOUT flows in the current path through the transistor P1 (VCC to P1 to VOUT) and hence may cause abnormal heating or breakage of the CMOS output circuit 100.

On the other hand, with the structure including the transistor N17, the transistor N17 is turned on in the fifth condition, and GPM is equal to VOUT, and thus the transistor PIO is turned on. Therefore, FNW is equal to VCC, and hence the transistor P1 can be securely turned off.

Note that the transistor N17 is merely the output leakage preventing means when the power is not turned on and does not affect an operation of the control portion 190 after the power is turned on.

Figure 9:
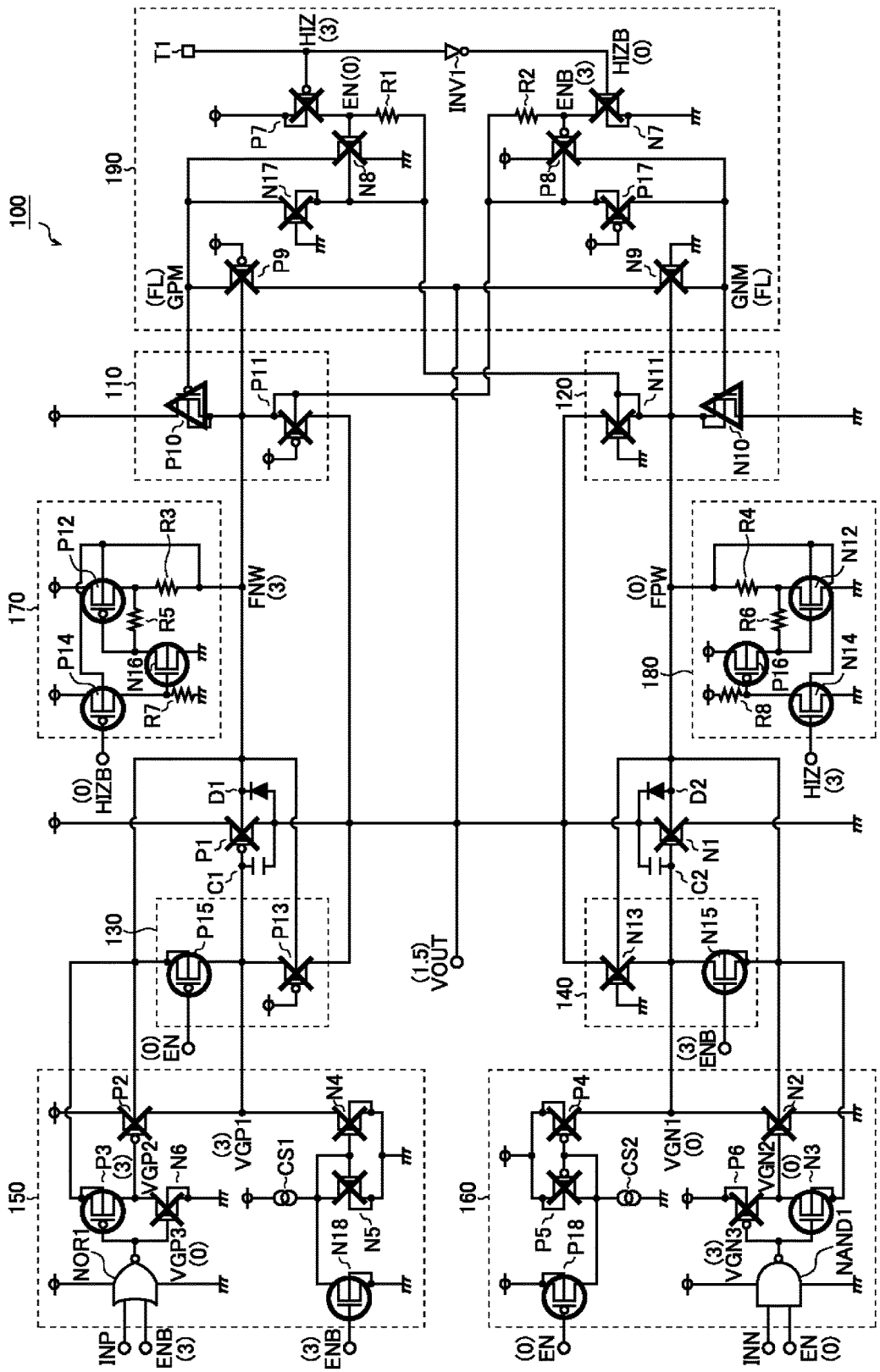
FIG. 9 is a circuit diagram illustrating an operating state of the CMOS output circuit in a sixth condition.

FIG. 9 is a circuit diagram illustrating an operating state of the CMOS output circuit 100 in a sixth condition (VCC is 3 V, GND is 0 V, HIZ is 3 V, and VOUT is 1.5 V). Note that the sixth condition corresponds to an example in the case where HIZ is high level in the truth table of FIG. 3 (GND<VOUT<VCC).

First, the control portion 190 is noted and described. When HIZ is 3 V, the transistor P7 is turned off. In this case, EN becomes 0 V (=FPW=GND) via the pull down path of the resistor RI, the transistor N8 is turned off In addition, in the sixth condition, the transistors P9 and N17 are also turned off. As a result, the gate of (GPM) of the transistor P10 becomes a floating state. In addition, when HIZ is 3 V, HIZB becomes 0 V (i.e. GND), and the transistor N7 is turned off. In this case, ENB becomes 3 V (=FNW=VCC) via the pull up path of the resistor R2, and hence the transistor P8 is turned off. In addition, in the sixth condition, the transistors N9 and P17 are also turned off. As a result, the gate (GNM) of the transistor N10 becomes a floating state.

In this way, in the sixth condition, both the gate voltages GPM and GNM are indefinite, and hence the transistors P10 and N10 cannot be securely turned on. Therefore, if the first potential fixing portion 170 and the second potential fixing portion 180 are not disposed, the first potential terminal (FNW) and the second potential terminal (FPW) become a floating state, and thus the gates of the transistors P1 and N1 (VGP1 and VGN1) also become a floating state. As a result, the transistors P1 and N1 cannot be securely maintained in the off state, and hence the unintended output current IOUT may be generated.

On the other hand, with the structure including the first potential fixing portion 170 and the second potential fixing portion 180, in the sixth condition, the first potential terminal (FNW) is pulled up to the power supply terminal (VCC), and the second potential terminal (FPW) is pulled down to the ground terminal (GND). Therefore, the transistors P1 and N1 can be securely turned off.

Figure 10:
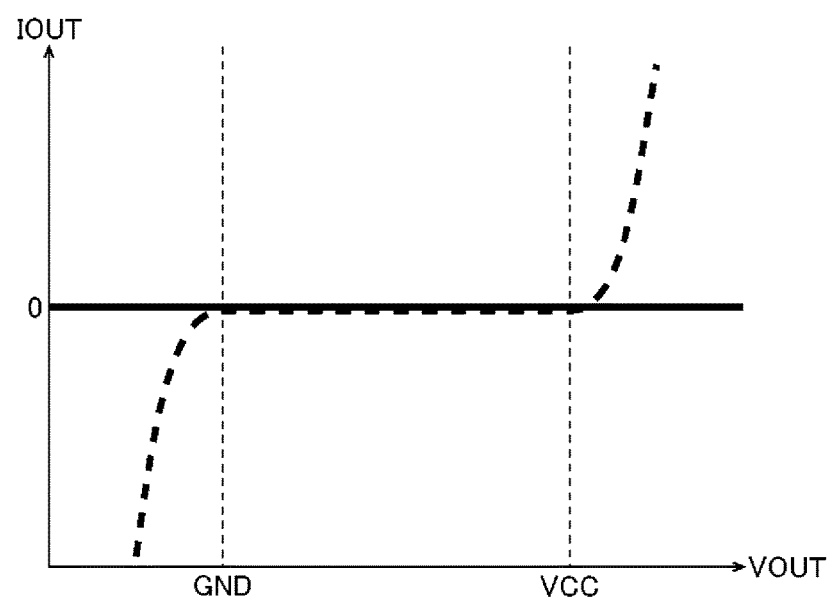
FIG. 10 is a correlation graph between output voltage and output current.

FIG. 10 is a correlation graph between the output voltage VOUT and the output current IOUT. Note that a solid line indicates an output behavior of the CMOS output circuit 100 in the output high impedance state, and a broken line indicates a conventional output behavior. As illustrated in this diagram, the CMOS output circuit 100 of this embodiment can control the output current IOUT to be substantially 0 A in the output high impedance state, even if any output voltage VOUT is applied.

Figure 11:
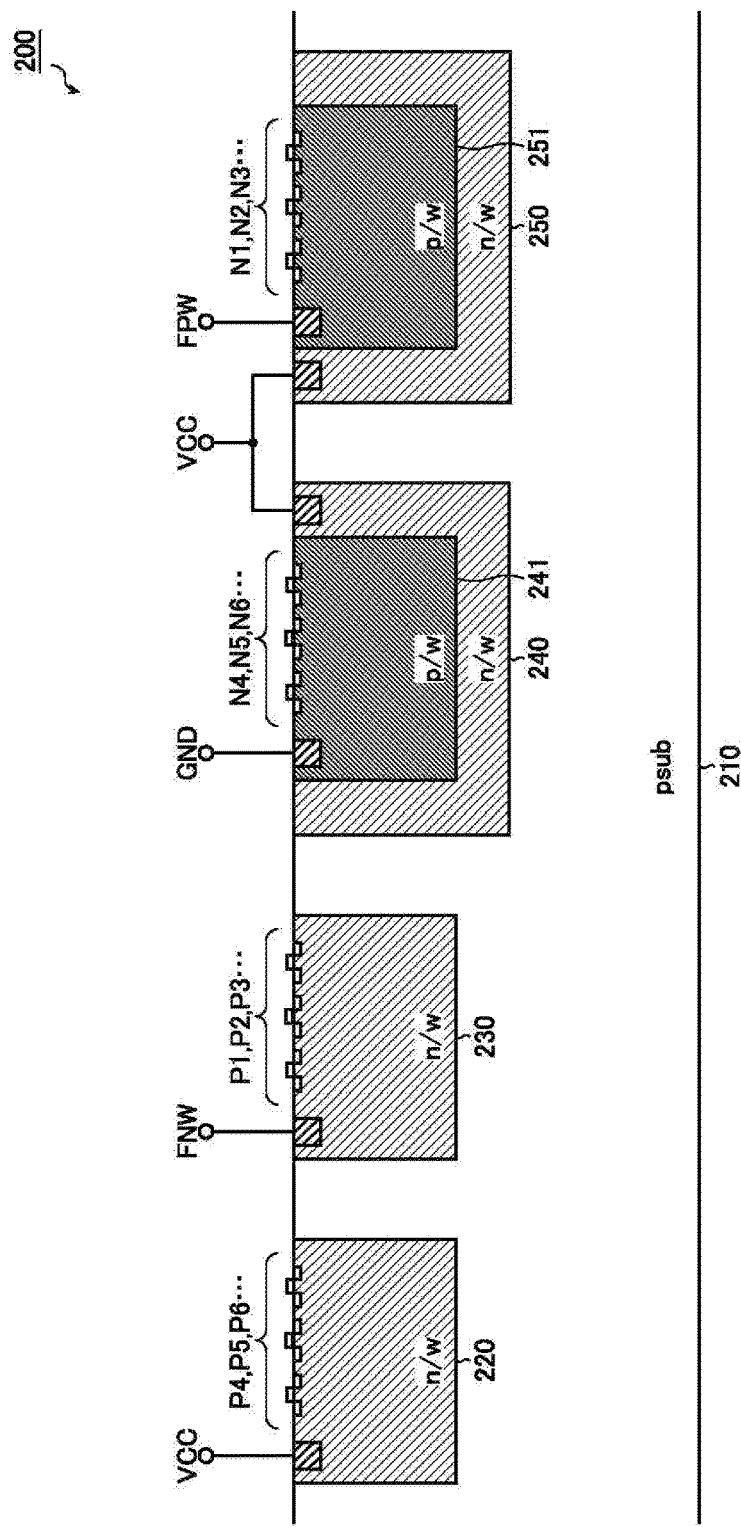
FIG. 11 is a vertical cross-sectional view schematically illustrating a vertical structure of a semiconductor device.

FIG. 11 is a vertical cross-sectional view schematically illustrating a vertical structure of a semiconductor device 200 in which the CMOS output circuit 100 is integrated. In the semiconductor device 200 of this diagram, potentially independent n-type wells 220 to 250 are formed in a p-type substrate 210. The n-type well 220 has contact with the power supply terminal (VCC). The n-type well 230 has contact with the first potential terminal (FNW). The n-type well 240 has contact with the power supply terminal (VCC), and a p-type well 241 is formed inside the same. The p-type well 241 has contact with the ground terminal (GND). The n-type well 250 has contact with the power supply terminal (VCC), and a p-type well 251 is formed inside the same. The p-type well 251 has contact with the second potential terminal (FPW).

Here, the P-MOSFETs (such as the transistors P4 to P6) having the back gates connected to the power supply terminal (VCC) are intensively formed in the n-type well 220. In addition, the P-MOSFETs (such as the transistors P1 to P3) having the back gates connected to the first potential terminal (FNW) are intensively formed in the n-type well 230.

On the other hand, the N-MOSFETs (such as the transistors N4 to N6) having the back gates connected to the ground terminal (GND) are intensively formed in the p-type well 241. In addition, the N-MOSFETs (such as the transistors N1 to N3) having the back gates connected to the second potential terminal (FPW) are intensively formed in the p-type well 251.

In this way, for integration of the CMOS output circuit 100, it is preferred to classify the transistors P1 to P18 and the transistors N1 to N18 into a plurality of transistor groups in accordance with connection destinations of their back gates, and to intensively form them in common wells corresponding to the groups. By adopting this element layout, unnecessary increase in chip area can be avoided.

Second Embodiment

Figure 12:
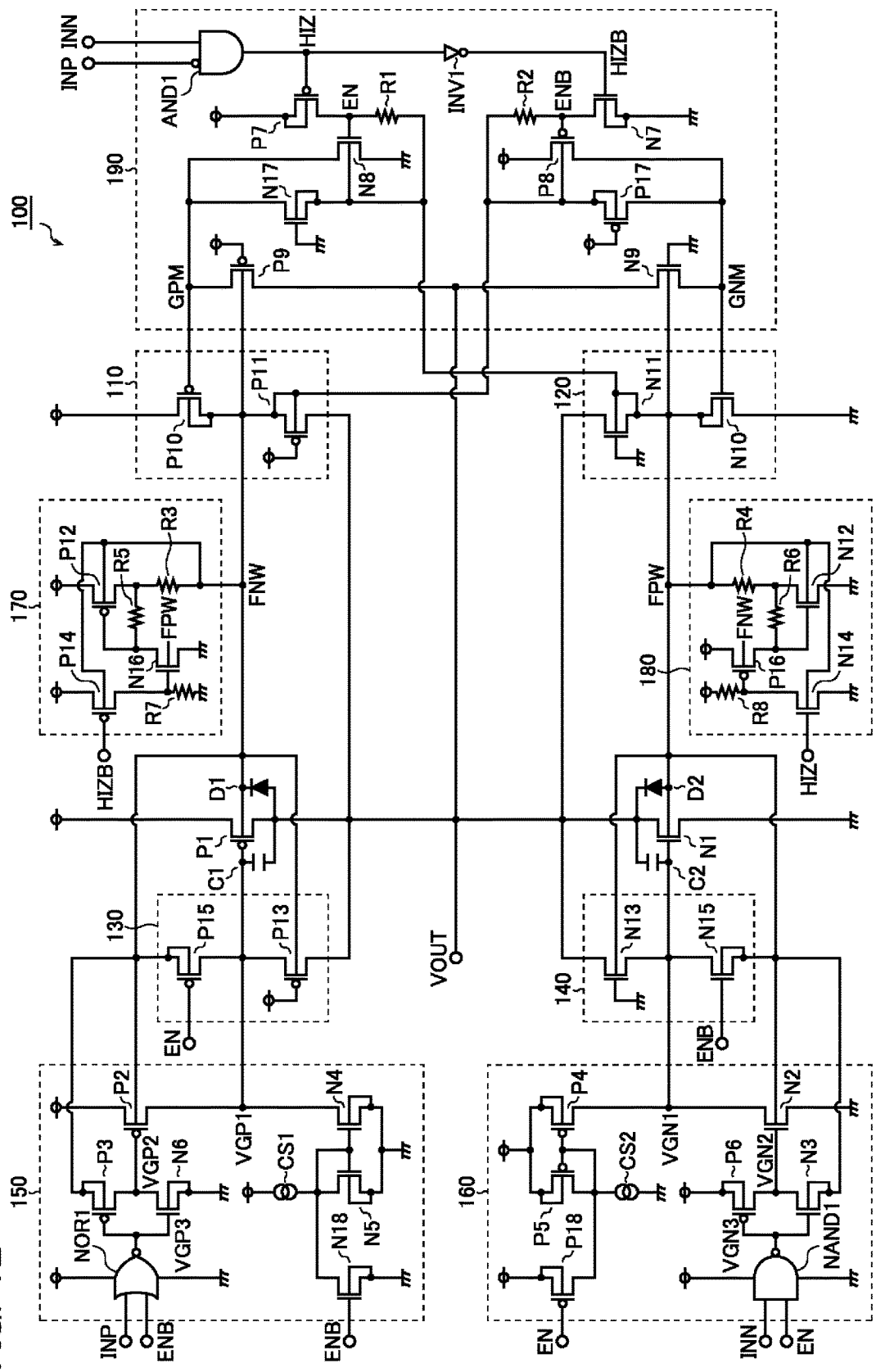
FIG. 12 is a circuit diagram illustrating a second embodiment of the CMOS output circuit.

FIG. 12 is a circuit diagram illustrating a second embodiment of the CMOS output circuit 100. The second embodiment is based on the first embodiment described above (FIG. 2) and has a feature that an AND operator AND 1 is disposed instead of the external terminal T1. Therefore, the same structural element as in the first embodiment is denoted by the same reference numeral as in FIG. 2 so that overlapping description is omitted. Hereinafter, characteristic parts of the second embodiment are mainly described.

The AND operator AND1 generates the high impedance control signal HIZ described above by an AND operation between the inverted input signal INPB (i.e. a logically inverted signal of the input signal INP) and the input signal INN. The high impedance control signal HIZ generated in this way becomes high level when INP is low level while INN is high level, and becomes low level in other cases.

In other words, when the CMOS output circuit 100 is in the output high impedance state in accordance with the input signals INP and INN (see FIG. 3), the high impedance control signal HIZ becomes high level. Therefore, it is possible to prevent or suppress the unintended output current IOUT in the output high impedance state, without necessity of any external control.

<USB Communication System>

Figure 13:
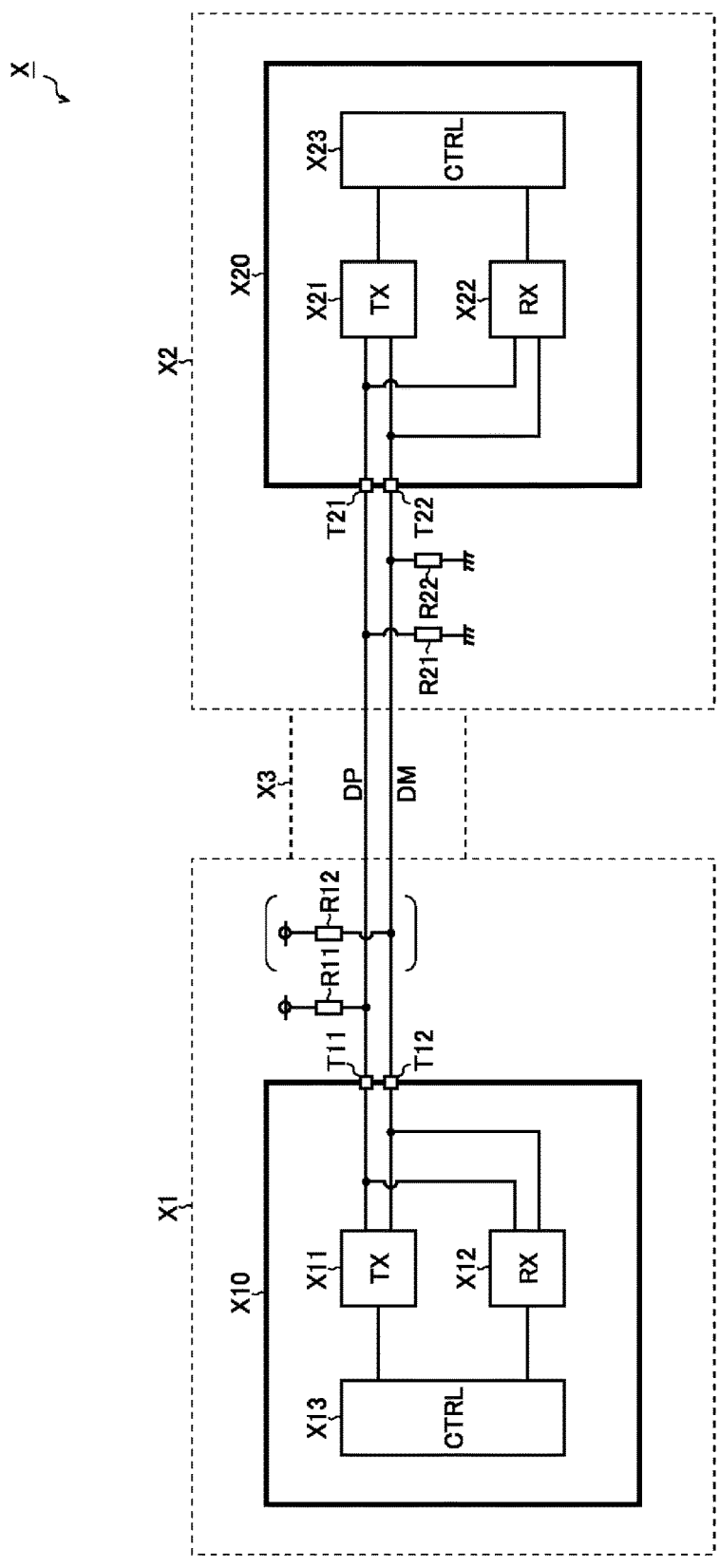
FIG. 13 is a block diagram illustrating an overall structure of a USB communication system.
Figure 14:
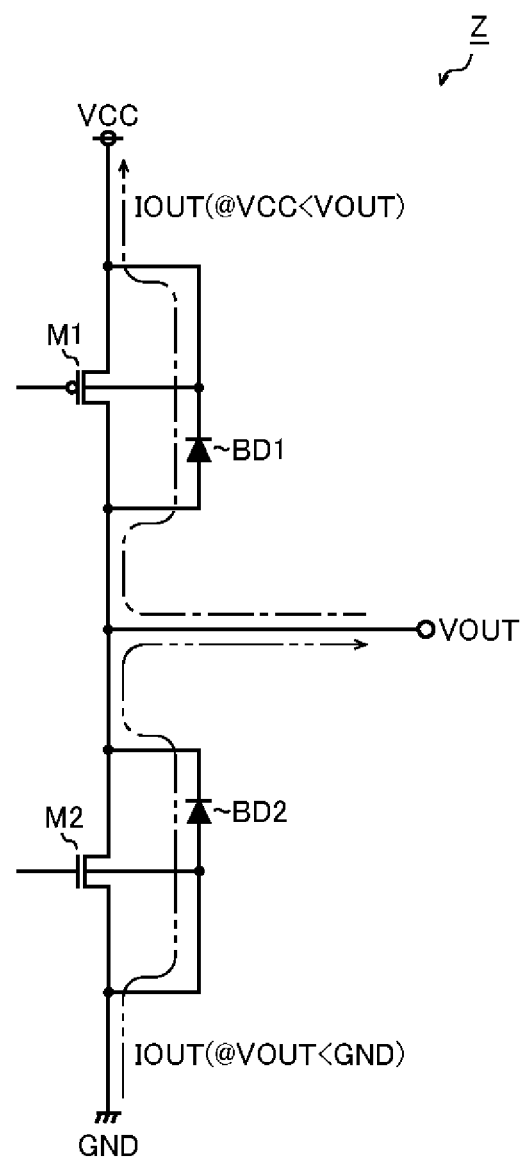
FIG. 14 is a circuit diagram illustrating a conventional example of the CMOS output circuit.

FIG. 13 is a block diagram illustrating an overall structure of a universal serial bus (USB) communication system. A USB communication system X of this structural example is an example of a communication system to which the CMOS output circuit 100 described above is applied, and includes a USB communication devices X1 and X2, and a USB communication cable X3. Note that the USB communication cable X3 includes two signal lines (i.e. a positive signal line DP and a negative signal line DM), and a power supply line and a ground line that are not shown, so that differential communication is performed between the USB communication device X1 and the USB communication device X2 via the USB communication cable X3.

A USB communication device X1 is a slave device such as a USB memory and includes the semiconductor device X10 and a pull-up resistor R11 (or R12). Note that if the USB communication device X1 adheres to the high speed standard (480 Mbps), the pull-up resistor R11 is connected to the positive signal line DP. On the other hand, if the USB communication device X1 adheres to the low speed standard (1.5 Mbps), the pull-up resistor R12 is connected to the negative signal line DM. Note that each of the pull-up resistors R11 and R12 has a resistance of 1.5 kΩ (±5%).

A USB communication device X2 is a master device such as a personal computer, and includes the semiconductor device X20 and pull down resistors R21 and R22. The pull down resistors R21 and R22 are connected to the positive signal line DP and the negative signal line DM, respectively. Note that each of the pull down resistors R21 and R22 has a resistance of 15 kΩ (+5%).

The semiconductor devices X10 and X20 respectively include transmitting portions X11 and X21, receiving portions X12 and X22, and communication control portions X13 and X23, which are respectively integrated. In addition, the semiconductor devices X10 and X20 respectively have external terminals T11 and T21 connected to the positive signal line DP, and external terminals T12 and T22 connected to the negative signal line DM.

The transmitting portions X11 and X21 respectively generate positive and negative transmission signals corresponding to instructions from the communication control portions X13 and X23, so as to output the signals to the positive signal line DP and the negative signal line DM. Note that the CMOS output circuit 100 described above can be appropriately used as a positive and negative output stage of each of the transmitting portions X11 and X21.

The receiving portions X12 and X22 detect positive and negative received signals input from the positive signal line DP and the negative signal line DM, respectively, so as to transfers the signals to the communication control portions X13 and X23, respectively.

The communication control portions X13 and X23 integrally controls the transmitting portions X11 and X21, and the receiving portions X12 and X22, respectively, so as to perform the differential communication between the USB communication devices X1 and X2.

Note that in this diagram the semiconductor devices X10 and X20 are denoted by different reference numerals for convenience of description, but the same IC can be used for the semiconductor devices X10 and X20 because there is no functional difference between them.

In the USB communication system X having the structure described above, each of the transmitting portions X11 and X12 has three output states, which are the output high level state, the output low level state, and the output high impedance state.

For example, in a connection waiting state in which nothing is connected to the USB communication device X2, the transmitting portion X21 is in the output high impedance state. In this case, the positive signal line DP and the negative signal line DM become low level via the pull down resistors R21 and R22, respectively.

In this connection waiting state, if the high speed standard USB communication device X1 is connected, the positive signal line DP is pulled up to high level by the pull-up resistor R11 having a resistance smaller than that of the pull down resistor R21. On the other hand, the negative signal line DM is kept pulled down to low level by the pull down resistor R22. Therefore, the USB communication device X2 can determine that the high speed standard USB communication device X1 is connected by detecting the signal level change described above.

On the contrary, in the connection waiting state described above, if the low speed standard USB communication device X1 is connected, the negative signal line DM is pulled up to high level by the pull-up resistor R12 having a resistance smaller than that of the pull down resistor R22. On the other hand, the positive signal line DP is kept pulled down to low level by the pull down resistor R21. Therefore, the USB communication device X2 can determine that the low speed standard USB communication device X1 is connected by detecting the signal level change described above.

In this way, the USB communication devices X1 and X2 may respectively make the transmitting portions X11 and X21 to the output high impedance state. In this case, the potential (i.e. VOUT) of each of the positive signal line DP and the negative signal line DM is basically fixed to high level (i.e. VCC) or low level (i.e. GND), but a certain factor (such as noise on the power supply line or the ground line) may cause the condition of VCC<DP (or VCC<DM), or DP<GND (or DM<GND). In view of this, in order to prevent or suppress occurrence of unintended output current in the transmitting portions X11 and X21, it is preferred to adopt the CMOS output circuit 100 described above as the output stage thereof.

<Other Variations>

Note that the various technical features disclosed in this specification can be variously modified within the scope without deviating from the spirit of the technical invention other than the embodiments described above. In other words, the embodiments described above are merely examples in every aspect and should not be interpreted as limitations. The technical scope of the present invention is defined not by the above description of the embodiments but by the claims, and should be understood to include all modifications within meaning and scope equivalent to the claims.

INDUSTRIAL APPLICABILITY

The CMOS output circuit disclosed in this specification can be used as an output stage of a data transmitting portion, for example.

What is claimed is:

1. A CMOS output circuit comprising:
    a first P-MOSFET having a source connected to a power supply terminal, a drain connected to an output terminal, and a back gate connected to a first potential terminal;
    a first N-MOSEFET having a drain connected to the output terminal, a source connected to a ground terminal, and a back gate connected to a second potential terminal;
    a first potential switching portion arranged to switch whether to connect the first potential terminal to the power supply terminal or to the output terminal;
    a second potential switching portion arranged to switch whether to connect the second potential terminal to the ground terminal or to the output terminal;
    a first gate switching portion arranged to switch whether or not to short-circuit the gate of the first P-MOSFET to the first potential terminal;
    a second gate switching portion arranged to switch whether or not to short-circuit the gate of the first N-MOSFET to the second potential terminal;
    a first driver arranged to drive the gate of the first P-MOSFET in accordance with a first input signal;
    a second driver arranged to drive the gate of the first N-MOSFET in accordance with a second input signal; and
    a control portion arranged to control individual portions of the circuit when turning off both the first P-MOSFET and the first N-MOSFET, so as to connect the first potential terminal to one of the power supply terminal and the output terminal, which has a higher potential, to connect the second potential terminal to one of the ground terminal and the output terminal, which has a lower potential, to short-circuit the gate of the first P-MOSFET to the first potential terminal, and to short-circuit the gate of the first N-MOSFET to the second potential terminal.

2. The CMOS output circuit according to claim 1, wherein the control portion includes an external terminal arranged to receive an input of a control signal, and controls the individual portions of the circuit in accordance with the control signal.

3. The CMOS output circuit according to claim 1, wherein the control portion includes a logical gate arranged to generate a control signal from the first input signal and the second input signal, and controls the individual portions of the circuit in accordance with the control signal.

4. The CMOS output circuit according to claim 1, wherein
    the first gate switching portion includes a first switch arranged to short-circuits between the gate of the first P-MOSFET and the first potential terminal, and a second switch arranged to short-circuits between the gate of the first P-MOSFET and the output terminal, and
    the second gate switching portion includes a third switch arranged to short-circuits between the gate of the first N-MOSFET and the second potential terminal, and a fourth switch arranged to short-circuits between the gate of the first N-MOSFET and the output terminal.

5. The CMOS output circuit according to claim 1, further comprising:
    a first potential fixing portion arranged to pull up the first potential terminal to the power supply terminal so that the first potential terminal does not have indefinite potential, and
    a second potential fixing portion arranged to pull down the second potential terminal to the ground terminal so that the second potential terminal does not have indefinite potential.

6. The CMOS output circuit according to claim 5, wherein the first potential fixing portion includes a first resistor arranged to limit current flowing between the first potential terminal and the power supply terminal, and the second potential fixing portion includes a second resistor arranged to limit current flowing between the second potential terminal and the ground terminal.

7. The CMOS output circuit according to claim 1, wherein
    the first driver includes a second P-MOSFET having a source connected to the power supply terminal, a drain connected to the gate of the first P-MOSFET, and a back gate connected to the first potential terminal, and a third P-MOSFET having a source and a back gate both connected to the first potential terminal, and a drain connected to the gate of the second P-MOSFET, and
    the second driver includes a second N-MOSFET having a source connected to the ground terminal, a drain connected to the gate of the first N-MOSFET, and a back gate connected to the second potential terminal, and a third N-MOSFET having a source and a back gate both connected to the second potential terminal, and a drain connected to the gate of the second N-MOSFET.

8. The CMOS output circuit according to claim 7, wherein
    the first driver further includes a fourth N-MOSFET having a source and a back gate both connected to the ground terminal, and a drain connected to the gate of the first P-MOSFET, a fifth N-MOSFET having a source and a back gate both connected to the ground terminal, and a drain and a gate both connected to the gate of the fourth N-MOSFET, a sixth N-MOSFET having a source and a back gate both connected to the ground terminal, a drain connected to the gate of the second P-MOSFET, and a gate connected to the gate of the third P-MOSFET, and a first current source connected between the power supply terminal and the drain of the fifth N-MOSFET, and
    the second driver further includes a fourth P-MOSFET having a source and a back gate both connected to the power supply terminal, and a drain connected to the gate of the first N-MOSFET, a fifth P-MOSFET having a source and a back gate connected to the power supply terminal, and a drain and a gate both connected to the gate of the fourth P-MOSFET, a sixth P-MOSFET having a source and a back gate connected to the power supply terminal, a drain connected to the gate of the second N-MOSFET, and a gate connected to the gate of the third N-MOSFET, and a second current source connected between the drain of the fifth P-MOSFET and the ground terminal.

9. The CMOS output circuit according to claim 1, wherein
    the P-MOSFETs respectively having back gates connected to the power supply terminal are intensively formed in a first n-type well having contact with the power supply terminal,
    the P-MOSFETs respectively having back gates connected to the first potential terminal are intensively formed in a second n-type well having contact with the first potential terminal, the N-MOSFETs respectively having back gates connected to the ground terminal are intensively formed in a first p-type well having contact with the ground terminal, and the N-MOSFETs respectively having back gates connected to the second potential terminal are intensively formed in a second p-type well having contact with the second potential terminal.

10. A communication device comprising a transmitting portion, wherein the transmitting portion includes the CMOS output circuit according to claim 1 as an output stage thereof.

* * * * *